(12) United States Patent
Shirahata et al.

(10) Patent No.: US 12,312,569 B2
(45) Date of Patent: May 27, 2025

(54) KIT FOR CLEANING AGENT AND METHOD FOR PREPARING CLEANING AGENT

(71) Applicant: FUJIFILM Corporation, Tokyo (JP)

(72) Inventors: Satoshi Shirahata, Kawagoe (JP);
Takahiro Yokomizo, Kawagoe (JP);
Yoshihisa Tsurumi, Kawagoe (JP);
Tsutomu Watahiki, Kawagoe (JP);
Takayuki Kajikawa, Kawagoe (JP);
Kohei Hayashi, Kawagoe (JP);
Hironori Mizuta, Kawagoe (JP)

(73) Assignee: FUJIFILM Corporation, Tokyo (JP)

( * ) Notice: Subject to any disclaimer, the term of this patent is extended or adjusted under 35 U.S.C. 154(b) by 973 days.

(21) Appl. No.: 17/358,717

(22) Filed: Jun. 25, 2021

(65) Prior Publication Data

US 2021/0317391 A1 Oct. 14, 2021

Related U.S. Application Data

(63) Continuation of application No. PCT/JP2019/046804, filed on Nov. 29, 2019.

(30) Foreign Application Priority Data

Dec. 28, 2018 (JP) .................. 2018-248458

(51) Int. Cl.
| | |
|---|---|
| C11D 3/28 | (2006.01) |
| C11D 3/30 | (2006.01) |
| C11D 3/32 | (2006.01) |
| C11D 3/33 | (2006.01) |
| C11D 7/32 | (2006.01) |
| C11D 17/08 | (2006.01) |
| H01L 21/304 | (2006.01) |

(52) U.S. Cl.
CPC .......... *C11D 7/3209* (2013.01); *C11D 7/3281* (2013.01); *C11D 17/08* (2013.01); *C11D 2111/22* (2024.01); *H01L 21/304* (2013.01)

(58) Field of Classification Search
CPC ....... C11D 3/042; C11D 3/044; C11D 3/2058; C11D 3/2065; C11D 3/2075; C11D 3/2086; C11D 3/28; C11D 3/30; C11D 3/32; C11D 3/33; C11D 7/32; C11D 7/3281; C11D 7/3209; C11D 11/0047; H01L 21/304
See application file for complete search history.

(56) References Cited

U.S. PATENT DOCUMENTS

| | | | |
|---|---|---|---|
| 9,862,914 B2 * | 1/2018 | Kajikawa | ............... C11D 7/34 |
| 2016/0272924 A1 * | 9/2016 | Kajikawa | ............... C11D 7/265 |
| 2019/0079409 A1 | 3/2019 | Takahashi et al. | |
| 2019/0177669 A1 * | 6/2019 | Kamimura | ............ H01L 21/304 |

FOREIGN PATENT DOCUMENTS

| | | | | |
|---|---|---|---|---|
| TW | 201527520 A | 7/2015 | | |
| TW | 201742954 A | 12/2017 | | |
| TW | 201816100 A | 5/2018 | | |
| TW | 201825663 A | 7/2018 | | |
| WO | WO 2008/036823 | * | 3/2008 | ......... C11D 11/0047 |
| WO | WO-2008036823 A2 | * | 3/2008 | ......... C11D 11/0047 |
| WO | 2015/068823 A1 | 5/2015 | | |
| WO | 2017/119244 A1 | 7/2017 | | |
| WO | 2017/208767 A1 | 12/2017 | | |
| WO | WO 2018/043440 | * | 3/2018 | ........... H01L 21/304 |
| WO | WO-2018043440 A1 | * | 3/2018 | ......... C11D 11/0029 |

OTHER PUBLICATIONS

International Search Report dated Jan. 28, 2020 from the International Searching Authority in International Application No. PCT/JP2019/046804.
Written Opinion dated Jan. 28, 2020 from the International Searching Authority in International Application No. PCT/JP2019/046804.
International Preliminary Report on Patentability with the translation of Written Opinion dated Jun. 16, 2021 from the International Bureau Authority in International Application No. PCT/JP2019/046804.
Office Action issued Jun. 5, 2023 in Taiwanese Application No. 108145419.

(Continued)

*Primary Examiner* — Brian P Mruk
(74) *Attorney, Agent, or Firm* — Sughrue Mion, PLLC

(57) ABSTRACT

The present invention addresses the problem of providing a kit for a cleaning agent, which is used for the purpose of preparing a cleaning agent that maintains, even after long-term storage, adequate impurity removal performance from the surface of a semiconductor substrate that has been subjected to a CMP process. The present invention also addresses the problem of providing a method for preparing the above-described cleaning agent. A kit for a cleaning agent according to the present invention is a kit for preparing a cleaning agent which is used for cleaning of a semiconductor substrate that has been subjected to a CMP process, and which has a pH of from 7.5 to 13.0. This kit for a cleaning agent comprises a first liquid that is acidic and contains a compound represented by formula (1) and a second liquid that is alkaline and contains a basic compound; and an acidic compound is contained in at least one of the first liquid and the second liquid.

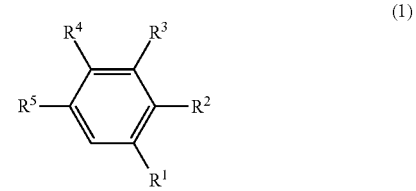

(1)

13 Claims, No Drawings

(56) References Cited

OTHER PUBLICATIONS

Office Action dated Oct. 12, 2023 in Taiwanese Application No. 108145419.
Japanese Office Action dated Apr. 11, 2023 in Japanese Application No. 2020-562978.
Office Action dated Nov. 1, 2022 from the Japanese Patent Office in JP Application No. 2020-562978.

\* cited by examiner

KIT FOR CLEANING AGENT AND METHOD FOR PREPARING CLEANING AGENT

CROSS-REFERENCE TO RELATED APPLICATIONS

This application is a Continuation of PCT International Application No. PCT/JP2019/046804 filed on Nov. 29, 2019, which claims priority under 35 U.S.C. § 119(a) to Japanese Patent Application No. 2018-248458 filed on Dec. 28, 2018. The above application is hereby expressly incorporated by reference, in its entirety, into the present application.

BACKGROUND OF THE INVENTION

The present invention relates to a cleaning agent kit for preparing a cleaning agent used in cleaning of a semiconductor substrate having undergone a chemical mechanical polishing process, and a method for preparing a cleaning agent.

Development is progressing to attain a finer structure and higher integration of semiconductor devices in accordance with the market needs for higher performance, compact sizing and the like. With the promotion of finer wiring constituting a semiconductor device, the performance of removing impurities on a surface of a semiconductor substrate is recognized as being important in cleaning after chemical mechanical polishing (CMP) that is one step in a manufacturing process of semiconductor devices.

WO 2015/068823 describes, as a cleaning agent used in cleaning of a semiconductor substrate having undergone the CMP process, a cleaning agent that is an aqueous solution containing (A) an organic acid, (B) an amine selected from diamines, amidines, azoles, and pyrazines or pyrimidines, (C) a hydroxylamine derivative, and (D) an oxygen scavenger and having a pH of 10 or higher.

SUMMARY OF THE INVENTION

The present inventors have further studied a cleaning agent for a semiconductor substrate having undergone the CMP process by reference to WO 2015/068823 and as a result found that when the cleaning agent is stored for a long period of time, the performance of removing foreign matter from a surface of a semiconductor substrate sometimes lowers, so that it is necessary to further improve temporal stability of the cleaning agent.

An object of the present invention is to provide a kit for preparing a cleaning agent with the performance of removing impurities on a surface of a semiconductor substrate having undergone the CMP process being maintained even after a long-term storage.

Another object of the present invention is to provide a method for preparing the cleaning agent.

The present inventors found that the above objects can be attained with the configuration as below.

[1]
A kit for preparing a cleaning agent with a pH of 8 to 14 that is used in cleaning of a semiconductor substrate having undergone a chemical mechanical polishing process, the kit comprising:
a first liquid containing a compound represented by Formula (1) described below and showing acidic properties; and
a second liquid containing a basic compound and showing alkaline properties,
wherein an acidic compound is contained in at least one of the first liquid and the second liquid.

[2]
The kit according to [1],
wherein the compound represented by Formula (1) includes at least one selected from the group consisting of pyrogallol, pyrocatechol, hydroquinone, dihydroxybenzoic acid, gallic acid, and gallic acid esters.

[3]
The kit according to [1] or [2],
wherein the compound represented by Formula (1) includes pyrogallol.

[4]
The kit according to any one of [1] to [3],
wherein the acidic compound includes carboxylic acid.

[5]
The kit according to [4],
wherein the carboxylic acid has two or more carboxyl groups.

[6]
The kit according to [4] or [5],
wherein the carboxylic acid further has at least one hydroxyl group.

[7]
The kit according to any one of [1] to [6],
wherein the basic compound includes at least one selected from the group consisting of a diamine compound, an amidine compound, an azole compound, a pyrazine compound, a pyrimidine compound, a hydroxylamine compound, and a quaternary ammonium compound.

[8]
The kit according to any one of [1] to [7],
wherein the basic compound includes at least one selected from the group consisting of a diamine compound, a hydroxylamine compound, and a quaternary ammonium compound.

[9]
The kit according to [7] or [8],
wherein the diamine compound is a compound represented by Formula (2) described below.

[10]
The kit according to any one of [7] to [9],
wherein the hydroxylamine compound is a compound represented by Formula (6) described below or its salt.

[11]
The kit according to any one of [7] to [10],
wherein the quaternary ammonium compound is at least one selected from the group consisting of tetramethylammonium hydroxide, tetraethylammonium hydroxide, tetrapropylammonium hydroxide, tetrabutylammonium hydroxide, 2-hydroxyethyl trimethylammonium hydroxide, and bis(2-hydroxyethyl) dimethylammonium hydroxide.

[12]
The kit according to any one of [1] to [11],
wherein the acidic compound is contained in at least the first liquid.

[13]
The kit according to any one of [1] to [12],
wherein the semiconductor substrate has either a copper wiring film or a copper alloy wiring film, and a cobalt-containing film.

[14]
The kit according to [13],
wherein the cobalt-containing film is a barrier metal of the copper wiring film or the copper alloy wiring film.

[15]

A method for preparing a cleaning agent with a pH of 8 to 14 that is used in cleaning of a semiconductor substrate having undergone a chemical mechanical polishing process, the method comprising:

at least a step of mixing the first liquid and the second liquid included in the kit according to any one of [1] to [14].

[16]

The method according to [15], further comprising:

a step of mixing at least one selected from the group consisting of the first liquid, the second liquid, and a mixed solution of the first liquid and the second liquid, with a third liquid containing water.

The present invention makes it possible to provide a cleaning agent with the performance of removing impurities on a surface of a semiconductor substrate having undergone the CMP process being maintained even after a long-term storage.

The present invention also makes it possible to provide a method for preparing the cleaning agent.

DETAILED DESCRIPTION OF THE INVENTION

One exemplary embodiment of the invention is described below.

In this description, a numerical range expressed in the form of "A to B" should read as a range including both the numbers A and B as the range's lower and upper limits, respectively.

In this description, "showing acidic properties" means that the pH is less than 7.0, while "showing alkaline properties" means that the pH is more than 7.0.

In this description, when a certain component comprising two or more types is present, the "content" of the certain component means the total content of the two or more types.

In compounds described in this description, isomers (compounds with the same number of atoms but different structures), optical isomers, and isotopes may be included unless particularly limited. As isomers and isotopes, only one type or plural types may be included.

[Kit]

A cleaning agent kit of the invention (hereinafter also simply called "kit") is a kit for preparing a cleaning agent used in cleaning of a semiconductor substrate having undergone a chemical mechanical polishing (CMP) process (hereinafter also simply called "cleaning agent"), and includes at least a first liquid showing acidic properties and a second liquid showing alkaline properties.

[Components]

Components that are contained in any of liquids included in the kit and are to be contained in the resulting cleaning agent prepared using the kit are described below.

<Compound Represented by Formula (1) (Component A)>

The first liquid of the kit contains a compound represented by Formula (1) below (hereinafter also called "component A"). The component A has the function of removing dissolved oxygen in the cleaning agent.

[Chemical Formula 1]

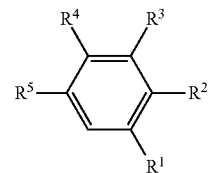

(1)

In the formula, $R^1$ to $R^5$ each independently represent a hydrogen atom, a hydroxyl group, a carboxyl group, or an alkoxycarbonyl group, and at least two of $R^1$ to $R^5$ represent a hydroxyl group. However, a combination in which each of $R^1$ and $R^5$ represents a hydroxyl group, a combination in which each of $R^2$ and $R^4$ represents a hydroxyl group, and a combination in which each of $R^3$ and $R^5$ represents a hydroxyl group are excluded.

An alkyl group in the alkoxycarbonyl group represented by $R^1$ to $R^5$ may be any of linear, branched and cyclic groups, and for instance, is a linear, branched or cyclic alkyl group having 1 to 6 carbon atoms. More specific examples thereof include a methyl group, an ethyl group, an n-propyl group, an isopropyl group, an n-butyl group, an isobutyl group, a sec-butyl group, a tert-butyl group, a cyclobutyl group, an n-pentyl group, an isopentyl group, a sec-pentyl group, a tert-pentyl group, a neopentyl group, a 2-methylbutyl group, a 1,2-dimethylpropyl group, a 1-ethylpropyl group, a cyclopentyl group, an n-hexyl group, an isohexyl group, a sec-hexyl group, a tert-hexyl group, a neohexyl group, a 2-methylpentyl group, a 1,2-dimethylbutyl group, a 2,3-dimethylbutyl group, a 1-ethylbutyl group, and a cyclohexyl group.

For the alkoxycarbonyl group represented by $R^1$ to $R^5$, an alkoxycarbonyl group having 1 to 4 carbon atoms is preferred, and a methoxycarbonyl group, an ethoxycarbonyl group or an n-propoxycarbonyl group is more preferred.

The number of hydroxyl groups in the component A is preferably 2 to 4, and more preferably 2 or 3.

When the component A has a carboxyl group or an alkoxycarbonyl group, the total number of carboxyl groups and alkoxycarbonyl groups is preferably 1 or 2, and more preferably 1.

For a combination of $R^1$ to $R^5$, preferred is a combination in which two or three of $R^1$ to $R^5$ represent a hydroxyl group and the remaining two or three thereof represent a hydrogen atom, or a combination in which one of $R^1$ to $R^5$ represents a carboxyl group or an alkoxycarbonyl group, two of $R^1$ to $R^5$ represent a hydroxyl group, and the remaining two thereof represent a hydrogen atom; and more preferred is a combination in which two or three of $R^1$ to $R^5$ represent a hydroxyl group and the remaining two or three thereof represent a hydrogen atom.

A preferred example of the component A is a compound represented by Formula (1-1) below:

[Chemical Formula 2]

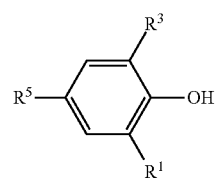

(1-1)

In Formula (1-1), $R^1$, $R^3$ and $R^5$ each independently represent a hydrogen atom, a hydroxyl group, a carboxyl group, or an alkoxycarbonyl group and are as defined above for $R^1$, $R^3$ and $R^5$ in Formula (1), respectively, and at least one of $R^1$, $R^3$ and $R^5$ represents a hydroxyl group.

The number of hydroxyl groups in Formula (1-1) is preferably 2 or 3. The total number of carboxyl groups and alkoxycarbonyl groups in Formula (1-1) is preferably 0 or 1.

Specific examples of the component A include pyrogallol, pyrocatechol, hydroquinone, dihydroxybenzoic acid, gallic acid, and gallic acid esters.

Examples of dihydroxybenzoic acid include 2,3-dihydroxybenzoic acid, 2,5-dihydroxybenzoic acid and 3,4-dihydroxybenzoic acid.

Examples of gallic acid esters include an ester of gallic acid and alcohol having 1 to 4 carbon atoms, with methyl gallate, ethyl gallate, or propyl gallate being preferred, and propyl gallate being more preferred.

For the component A, pyrogallol, pyrocatechol, hydroquinone, gallic acid, or a gallic acid ester is preferred and pyrogallol is more preferred for the reasons that they are easily available and that it is possible to further suppress galvanic corrosion between copper(I) oxide and cobalt(II) oxide that may occur when a copper wiring film or a copper alloy wiring film (hereinafter also called "copper-containing wiring film") is in contact with a cobalt-containing film at a surface of a semiconductor substrate.

As the component A, these may be used singly or in combination of two or more. As the component A, a commercial product or a composite obtained by a known method may be used.

<Basic Compound>

The second liquid included in the kit contains a basic compound. The basic compound is used to adjust and maintain the pH of the cleaning agent to the alkaline state.

Examples of the basic compound include a basic organic compound and a basic inorganic compound, and the basic organic compound is preferred because it contains no metal ions and has less adverse effects on electrical properties of a semiconductor device.

Examples of the basic organic compound include organic amines, hydroxylamine compounds, and quaternary ammonium compounds.

The organic amines refer to compounds in which one or more hydrogen atoms of ammonia are substituted with an organic group, exclusive of hydroxylamine compounds (hydroxylamines, hydroxylamine derivatives, and their salts) to be described later.

The organic group is not particularly limited as long as it is a group having at least one carbon atom, and examples thereof include linear or branched aliphatic hydrocarbon groups, alicyclic hydrocarbon groups and aromatic groups, and the combinations thereof.

The number of carbon atoms of the basic organic compound is preferably 2 to 30, and because of high solubility in water and less fear of remaining on a surface of a semiconductor substrate, 2 to 16 carbon atoms are more preferred.

(Organic Amine)

The second liquid may contain an organic amine as the basic compound.

Examples of the organic amine include a monoamine compound having one amino group in the molecule, a diamine compound having two amino groups in the molecule, and a polyamine compound having three or more amino groups in the molecule.

For the organic amine, preferred is a diamine compound, an amidine compound, an azole compound, a pyrazine compound, or a pyrimidine compound, which will be described later.

—Diamine Compound—

The diamine compound refers to a compound having a diamine structure in which two amino groups are bonded by at least one organic group selected from the group consisting of linear or branched aliphatic hydrocarbon groups, alicyclic hydrocarbon groups and aromatic groups, and the combinations thereof.

The diamine compound is not particularly limited as long as it is a compound having the diamine structure as above, and examples thereof include aliphatic diamines such as ethylenediamine, propylenediamine, isopropyldiamine and butyldiamine, and aromatic diamines such as diaminobenzene and diaminonaphthalene.

For the diamine compound, a compound represented by Formula (2) is preferred.

[Chemical Formula 3]

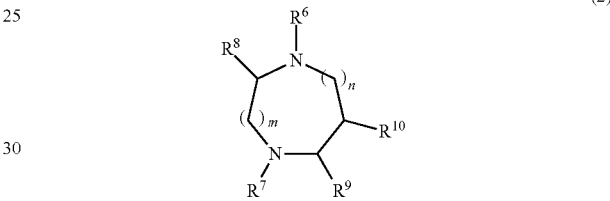

(2)

In the formula, $R^6$ and $R^7$ each independently represent a hydrogen atom, an alkyl group having 1 to 4 carbon atoms, or an aryl group having 6 to 10 carbon atoms.

$R^8$ represents a hydrogen atom, a hydroxyl group, or an alkyl group having 1 to 4 carbon atoms that may have a hydroxyl group.

$R^9$ and $R^{10}$ each independently represent a hydrogen atom or an alkyl group having 1 to 4 carbon atoms.

A combination of $R^6$ and $R^7$, a combination of $R^7$ and $R^{10}$, and a combination of $R^8$ and $R^{10}$ may be each independently bonded together to form an alkylene group having 1 to 3 carbon atoms.

m represents 0 or 1.

n represents an integer of 0 to 2.

The alkyl group having 1 to 4 carbon atoms represented by $R^6$ to $R^{10}$ in Formula (2) may be any of linear, branched and cyclic groups. Examples of the alkyl group having 1 to 4 carbon atoms represented by $R^6$ to $R^{10}$ include a methyl group, an ethyl group, an n-propyl group, an isopropyl group, an n-butyl group, an isobutyl group, a sec-butyl group, a tert-butyl group, and a cyclobutyl group, with a methyl group being preferred.

The aryl group having 6 to 10 carbon atoms represented by $R^6$ and $R^7$ may be either of monocyclic and condensed polycyclic groups, and examples thereof include a phenyl group and a naphthyl group. For the aryl group having 6 to 10 carbon atoms represented by $R^6$ and $R^7$, a phenyl group is preferred.

The alkyl group having 1 to 4 carbon atoms that may have a hydroxyl group as represented by $R^8$ may be any of linear, branched and cyclic groups and may have one or plural hydroxyl groups.

Specific examples of the alkyl group having 1 to 4 carbon atoms that may have a hydroxyl group as represented by $R^8$ include groups listed above as the specific examples of the alkyl group having 1 to 4 carbon atoms represented by $R^6$ to $R^{10}$, a hydroxymethyl group, a 1-hydroxyethyl group, a 2-hydroxyethyl group, a 1,2-dihydroxyethyl group, a 1-hydroxy-n-propyl group, a 2-hydroxy-n-propyl group, a 3-hydroxy-n-propyl group, a 1,2-dihydroxy-n-propyl group, a 1,3-dihydroxy-n-propyl group, a 2,3-dihydroxy-n-propyl group, a 1,2,3-trihydroxy-n-propyl group, a 1-hydroxyisopropyl group, a 2-hydroxyisopropyl group, a 1-hydroxymethyl-1-hydroxyethyl group, a 1-hydroxymethyl-2-hydroxyethyl group, a 1-hydroxymethyl-1,2-dihydroxyethyl group, a 1-hydroxy-n-butyl group, a 2-hydroxy-n-butyl group, a 3-hydroxy-n-butyl group, and a 4-hydroxy-n-butyl group.

The alkylene group having 1 to 3 carbon atoms in the case where a combination of $R^6$ and $R^7$, a combination of $R^7$ and $R^{10}$, and a combination of $R^8$ and $R^{10}$ are each bonded together to form an alkylene group having 1 to 3 carbon atoms, may be either of linear and branched groups. Examples of the alkylene group having 1 to 3 carbon atoms include a methylene group, an ethylene group (dimethylene group), a trimethylene group (propane-1,3-diyl group), and a propylene group (propane-1,2-diyl group), with an ethylene group being preferred.

For m, 1 is preferred.

For n, 0 or 1 is preferred, and 0 is more preferred.

For $R^6$ and $R^7$, it is preferable that $R^6$ and $R^7$ represent a hydrogen atom or an alkyl group having 1 to 4 carbon atoms or that $R^6$ and $R^7$ form an alkylene group having 1 to 3 carbon atoms; it is more preferable that $R^6$ and $R^7$ represent a hydrogen atom or that $R^6$ and $R^7$ form an alkylene group having 1 to 3 carbon atoms; and a hydrogen atom is even more preferred.

For $R^8$ to $R^{10}$, a hydrogen atom is preferred.

Examples of the diamine compound represented by Formula (2) include piperazine, 1-methylpiperazine, 1-ethylpiperazine, 1-propylpiperazine, 1-butylpiperazine, 2-methylpiperazine, 1,4-dimethylpiperazine, 2,5-dimethylpiperazine, 2,6-dimethylpiperazine, 1-phenylpiperazine, 2-hydroxypiperazine, 2-hydroxymethylpiperazine, hexahydro-1H-1,4-diazepine, 1-methylhexahydro-1H-1,4-diazepine, 2-methylhexahydro-1H-1,4-diazepine, 6-methylhexahydro-1H-1,4-diazepine, octahydro-2-methyl-1,4-diazocine, 1,4-diazabicyclo[2.2.2]octane, 2,7-diazabicyclo[3.2.1]octane, and 1,3-diazabicydo[3.2.2]nonane.

For the diamine compound represented by Formula (2), a diamine compound represented by Formula (2-1) below is preferred.

[Chemical Formula 4]

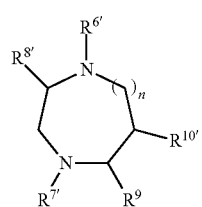

(2-1)

In the formula, $R^{6'}$ and $R^{7'}$ each independently represent a hydrogen atom or an alkyl group having 1 to 4 carbon atoms.

$R^{8'}$ represents a hydrogen atom, a hydroxyl group, or an alkyl group having 1 to 4 carbon atoms that may have a hydroxyl group.

$R^{10'}$ represents a hydrogen atom or an alkyl group having 1 to 4 carbon atoms.

$R^{6'}$ and $R^{7'}$ may be bonded together to form an alkylene group having 1 to 3 carbon atoms.

$R^9$ and n, including their preferable forms, are the same as $R^9$ and n in Formula (2).

Specific examples of an alkyl group having 1 to 4 carbon atoms represented by $R^{6'}$, $R^{7'}$ and $R^{10'}$ in Formula (2-1) include those listed as the specific examples of the alkyl group having 1 to 4 carbon atoms represented by $R^6$ to $R^{10}$ in Formula (2), and their preferable forms are also the same.

Specific examples of an alkyl group having 1 to 4 carbon atoms that may have a hydroxyl group as represented by $R^{8'}$ in Formula (2-1) include those listed as the specific examples of the alkyl group having 1 to 4 carbon atoms that may have a hydroxyl group as represented by $R^8$ in Formula (2).

Specific examples of an alkylene group having 1 to 3 carbon atoms in the case where $R^{6'}$ and $R^{7'}$ are bonded together to form an alkylene group having 1 to 3 carbon atoms include those listed as the specific examples of the alkylene group having 1 to 3 carbon atoms in Formula (2), and their preferable forms are also the same.

For $R^{8'}$ and $R^{10'}$ in Formula (2-1), a hydrogen atom is preferred.

Specific examples of the diamine compound represented by Formula (2-1) include piperazine, 1-methylpiperazine, 1-ethylpiperazine, 1-propylpiperazine, 1-butylpiperazine, 2-methylpiperazine, 1,4-dimethylpiperazine, 2,5-dimethylpiperazine, 2,6-dimethylpiperazine, 2-hydroxypiperazine, 2-hydroxymethylpiperazine, hexahydro-1H-1,4-diazepine, 1-methylhexahydro-1H-1,4-diazepine, 2-methylhexahydro-1H-1,4-diazepine, 6-methylhexahydro-1H-1,4-diazepine, octahydro-2-methyl-1,4-diazocine, and 1,4-diazabicyclo[2.2.2]octane.

For the diamine compound represented by Formula (2) and the diamine compound represented by Formula (2-1), piperazine, hexahydro-1H-1,4-diazepine, or 1,4-diazabicyclo[2.2.2]octane is preferred because of availability and higher performance of removing a coating (hereinafter also called "protection film") that contains a corrosion inhibitor such as benzotriazole and is formed on a surface of a copper-containing wiring film.

—Amidine Compound—

The amidine compound refers to a compound having an amidine structure represented by R—C(=NR)—NR$_2$ (where R represents a hydrogen atom or an organic group, and two R's may be bonded together to form a divalent organic group). The organic group is not particularly limited as long as it is a group having at least one carbon atom, and examples thereof include linear or branched aliphatic hydrocarbon groups, alicyclic hydrocarbon groups and aromatic groups, and the combinations thereof.

The amidine compound is not particularly limited as long as it is a compound having the foregoing amidine structure, and one example thereof is a compound represented by Formula (3).

[Chemical Formula 5]

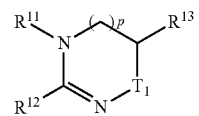

(3)

In the formula, $R^{11}$ represents an alkyl group having 1 to 4 carbon atoms.

$R^{12}$ represents an amino group.

$R^{11}$ and $R^{12}$ may be bonded together to form an alkylene group having 3 to 6 carbon atoms.

$R^{13}$ represents a hydrogen atom or an alkyl group having 1 to 4 carbon atoms.

$T_1$ represents a —$CH_2$— group or a —C(=O)— group.

p represents 0 or 1.

An alkyl group having 1 to 4 carbon atoms represented by Rif and $R^{13}$ in Formula (3), including its specific examples and preferable forms, is the same as the alkyl group having 1 to 4 carbon atoms represented by $R^6$ to $R^{10}$ in Formula (2).

The alkylene group having 3 to 6 carbon atoms in the case where $R^{11}$ and $R^{12}$ are bonded together to form an alkylene group having 3 to 6 carbon atoms, may be either of linear and branched groups.

Examples of the alkylene group having 3 to 6 carbon atoms include a trimethylene group (propane-1,3-diyl group), a propylene group (propane-1,2-diyl group), a tetramethylene group (butane-1,4-diyl group), a 1-methyltrimethylene group (1-methylpropane-1,3-diyl group), a 2-methyltrimethylene group (2-methylpropane-1,3-diyl group), a 1,2-dimethylethylene group (1,2-dimethyldimethylene group), a pentamethylene group (pentane-1,5-diyl group), 2,2-dimethyltrimethylene group (2,2-dimethylpropane-1,3-diyl group), and a hexamethylene group (hexane-1,6-diyl group).

Of these, a trimethylene group, a tetramethylene group, a pentamethylene group, or a hexamethylene group is preferred, and a trimethylene group, a tetramethylene group, or a pentamethylene group is more preferred.

For $R^{13}$, a hydrogen atom or a methyl group is preferred, and a hydrogen atom is more preferred.

For $T_1$, a —$CH_2$— group is preferred.

For p, 1 is preferred.

Examples of the amidine compound represented by Formula (3) include diazabicycloundecene (1,8-diazabicyclo[5.4.0]undec-7-ene: DBU), diazabicyclononene (1,5-diazabicyclo[4.3.0]non-5-ene: DBN), 3,4,6,7,8,9,10,11-octahydro-2H-pyrimido[1.2-a]azocine, 3,4,6,7,8,9-hexahydro-2H-pyrido[1.2-a]pyrimidine, 2,5,6,7-terahydro-3H-pyrrolo[1.2-a]imidazole, 3-ethyl-2,3,4,6,7,8,9,10-octahydropyrimido[1.2-a]azepine, and creatinine.

For the amidine compound represented by Formula (3), a compound represented by Formula (3-1) below or a compound represented by Formula (3-2) below is preferred.

[Chemical Formula 6]

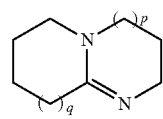

(3-1)

In the formula, q represents an integer of 0 to 3.

p, including its preferable forms, is the same as p in Formula (3).

[Chemical Formula 7]

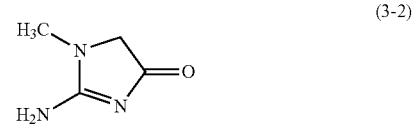

(3-2)

For q in Formula (3-1), an integer of 0 to 2 is preferred.

Specific examples of the compound represented by Formula (3-1) include DBU, DBN, 3,4,6,7,8,9,10,11-octahydro-2H-pyrimido[1.2-a]azocine, 3,4,6,7,8,9-hexahydro-2H-pyrido[1.2-a]pyrimidine, 2,5,6,7-tetrahydro-3H-pyrrolo[1.2-a]imidazole, and 3-ethyl-2,3,4,6,7,8,9,10-octahydropyrimido[1.2-a]azepine.

For the amidine compound represented by Formula (3), DBU, DBN or creatinine is preferred because of availability and higher performance of removing a protection film formed on a surface of a copper-containing wiring film.

—Azole Compound—

The azole compound refers to a compound containing one or more nitrogen atoms and having a heterocyclic five-membered ring with aromatic properties.

The azole compound is not particularly limited as long as it is a compound having the heterocyclic five-membered ring as above, and one example thereof is a compound represented by Formula (4).

[Chemical Formula 8]

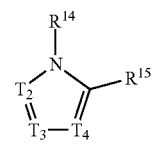

(4)

In the formula, $R^{14}$ represents a hydrogen atom or an alkyl group having 1 to 4 carbon atoms.

$R^{15}$ represents a hydrogen atom, a mercapto group, an amino group, an alkyl group having 1 to 4 carbon atoms, or a 2-imidazolyl group.

$T_2$ represents a nitrogen atom or a —C(—$R^{16}$)=group.

$R^{16}$ represents a hydrogen atom or an alkyl group having 1 to 4 carbon atoms.

$T_3$ represents a nitrogen atom or a =C(—$R^{17}$)— group.

$R^{17}$ represents a hydrogen atom, a hydroxyl group, a carboxyl group, an amino group, or an alkyl group having 1 to 4 carbon atoms that may have an amino group.

$T_4$ represents a nitrogen atom or a —CH=group.

Here, at least one of $T_2$ and $T_4$ represents a nitrogen atom.

An alkyl group having 1 to 4 carbon atoms represented by $R^{14}$ to $R^{17}$, including its specific examples and preferable forms, is the same as the alkyl group having 1 to 4 carbon atoms represented by $R^6$ to $R^{10}$ in Formula (2).

The alkyl group having 1 to 4 carbon atoms that may have an amino group as represented by $R^{17}$ may have one or plural amino groups. Examples of the alkyl group having 1 to 4 carbon atoms that may have an amino group in Formula (4) include the groups listed as the specific examples of the alkyl group having 1 to 4 carbon atoms represented by $R^6$ to $R^{10}$ in Formula (2), an aminomethyl group, a 1-aminoethyl group, a 2-aminoethyl group, a 1,2-diaminoethyl group, a 1-amino-n-propyl group, a 2-amino-n-propyl group, a 3-amino-n-propyl group, a 1,2-diamino-n-propyl group, a 1,3-diamino-n-propyl group, a 2,3-diamino-n-propyl group, a 1,2,3-triamino-n-propyl group, a 1-aminoisopropyl group, a 2-aminoisopropyl group, a 1-aminomethyl-1-aminoethyl group, a 1-aminomethyl-2-aminoethyl group, a 1-aminomethyl-1,2-diaminoethyl group, a 1-amino-n-butyl group, a 2-amino-n-butyl group, a 3-amino-n-butyl group, and a 4-amino-n-butyl group.

For the alkyl group having 1 to 4 carbon atoms that has an amino group as represented by $R^{17}$, an aminomethyl group, a 1-aminoethyl group, a 2-aminoethyl group, a 1-amino-n-propyl group, a 2-amino-n-propyl group, a 3-amino-n-propyl group, a 1-amino-n-butyl group, a 2-amino-n-butyl group, a 3-amino-n-butyl group, or a 4-amino-n-butyl group is preferred.

In Formula (4), it is preferable that one, two or three of $T_2$, $T_3$ and $T_4$ represent a nitrogen atom, and it is more preferable that one or two thereof represent a nitrogen atom.

For $R^{14}$, a hydrogen atom is preferred.

For $R^{15}$, a hydrogen atom, a mercapto group, an amino group, or a 2-imidazolyl group is preferred.

For $R^{16}$, a hydrogen atom is preferred.

For $R^{17}$, a hydrogen atom, a carboxyl group, or an alkyl group having 1 to 4 carbon atoms that may have an amino group is preferred, and a hydrogen atom, a carboxyl group, a methyl group, an ethyl group, a 1-aminoethyl group, or a 2-aminoethyl group is more preferred.

For the azole compound represented by Formula (4), an imidazole compound represented by Formula (4-1) below, a pyrazole compound represented by Formula (4-2) below, a 1,2,4-triazole compound represented by Formula (4-3) below, a 1,2,3-triazole compound represented by Formula (4-4) below, or a tetrazole compound represented by Formula (4-5) below is preferred.

[Chemical Formula 9]

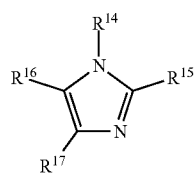

(4-1)

[Chemical Formula 10]

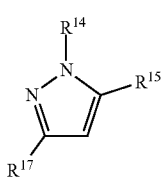

(4-2)

[Chemical Formula 11]

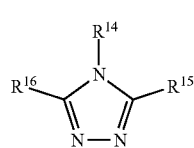

(4-3)

[Chemical Formula 12]

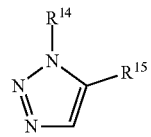

(4-4)

[Chemical Formula 13]

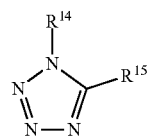

(4-5)

$R^{14}$ to $R^{17}$ in Formulae (4-1) to (4-5), including their specific examples and preferable forms, are the same as $R^{14}$ to $R^{17}$ in Formula (4).

Examples of the imidazole compound represented by Formula (4-1) include imidazole, 1-methylimidazole, 2-methylimidazole, 5-methylimidazole, 1,2-dimethylimidazole, 2-mercaptoimidazole, 4,5-dimethyl-2-mercaptoimidazole, 4-hydroxyimidazole, 2,2'-biimidazole, 4-imidazolecarboxylic acid, and histamine.

Examples of the pyrazole compound represented by Formula (4-2) include pyrazole, 4-pyrazolecarboxylic acid, 1-methylpyrazole, and 3-methylpyrazole.

Examples of the 1,2,4-triazole compound represented by Formula (4-3) include 1,2,4-triazole, 3-methyl-1,2,4-triazole, and 3-amino-1,2,4-triazole.

Examples of the 1,2,3-triazole compound represented by Formula (4-4) include 1,2,3-triazole, and 5-methyl-1,2,3-triazole.

Examples of the 1,2,3,4-tetrazole compound represented by Formula (4-5) include 1,2,3,4-tetrazole, and 5-methyl-1,2,3,4-tetrazole.

For the azole compound represented by Formula (4), imidazole, 2-mercaptoimidazole, 2,2'-biimidazole, histamine, pyrazole, 1,2,4-triazole, 3-amino-1,2,4-triazole, or 1,2,3-triazole is preferred, and 1,2,4-triazole is more preferred, because of availability and higher performance of removing a protection film formed on a surface of a copper-containing wiring film.

—Pyrazine Compound or Pyrimidine Compound—

The pyrazine compound refers to a compound having a pyrazine ring structure, and the pyrimidine compound refers to a compound having a pyrimidine ring structure.

The pyrazine compound and the pyrimidine compound are not particularly limited as long as they are compounds having the relevant one of the pyrazine ring structure and the pyrimidine ring structure, and one example thereof is a compound represented by Formula (5).

[Chemical Formula 14]

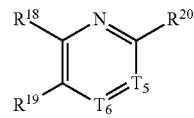

(5)

In the formula, $R^{18}$ to $R^{20}$ each independently represent a hydrogen atom, a hydroxyl group, an amino group, a carboxyl group, or an alkyl group having 1 to 4 carbon atoms that may have a hydroxyl group.

$T_5$ represents a nitrogen atom or a =C(—$R^{21}$)— group.

$R^{21}$ represents a hydrogen atom, a hydroxyl group, an amino group, a carboxyl group, or an alkyl group having 1 to 4 carbon atoms that may have a hydroxyl group.

$T_6$ represents a nitrogen atom or a —C(—$R^{22}$)=group.

$R^{22}$ represents a hydrogen atom, a hydroxyl group, an amino group, a carboxyl group, or an alkyl group having 1 to 4 carbon atoms that may have a hydroxyl group.

The alkyl group having 1 to 4 carbon atoms that may have a hydroxyl group as represented by $R^{18}$ to $R^{22}$ may be any of linear, branched and cyclic groups and may have one or plural hydroxyl groups.

Specific examples of the alkyl group having 1 to 4 carbon atoms that may have a hydroxyl group as represented by $R^{18}$ to $R^{22}$ in Formula (5) include those listed as the specific examples of the alkyl group having 1 to 4 carbon atoms that may have a hydroxyl group as represented by $R^8$ in Formula (2).

Of these, an alkyl group having 1 to 4 carbon atoms that has no hydroxyl group is preferred, a methyl group, an ethyl group, an n-propyl group, an isopropyl group, an n-butyl group, an isobutyl group, a sec-butyl group, a tert-butyl group, or a cyclobutyl group is more preferred, and a methyl group is even more preferred.

For $R^{18}$ to $R^{22}$, a hydrogen atom, or an alkyl group having 1 to 4 carbon atoms that may have a hydroxyl group is preferred, a hydrogen atom or a methyl group is more preferred, and a hydrogen atom is even more preferred.

For a combination of $T_5$ and $T_6$, a combination in which at least one of $T_5$ and $T_6$ is a nitrogen atom is preferred, and a combination in which only one of $T_5$ and $T_6$ is a nitrogen atom is more preferred.

For the compound represented by Formula (5), a pyrazine compound represented by Formula (5-1) or a pyrimidine compound represented by Formula (5-2) is preferred.

[Chemical Formula 15]

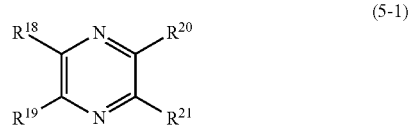

(5-1)

[Chemical Formula 16]

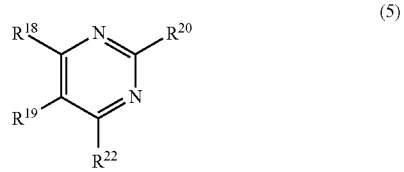

(5)

$R^{18}$ to $R^{22}$ in Formulae (5-1) and (5-2), including their specific examples and preferable forms, are the same as $R^{18}$ to $R^{22}$ in Formula (5).

Examples of the pyrazine compound represented by Formula (5-1) include pyrazine, 2-methylpyrazine, 2,5-dimethylpyrazine, 2,3,5,6-tetramethylpyrazine, 2-ethyl-3-methylpyrazine, and 2-amino-5-methylpyrazine.

Examples of the pyrimidine compound represented by Formula (5-2) include pyrimidine, 2-methylpyrimidine, and 4,6-dimethylpyrimidine.

For the compound represented by Formula (5), pyrazine is preferred because of availability and higher performance of removing a protection film formed on a surface of a copper-containing wiring film.

—Other Organic Amines—

The second liquid may contain an organic amine other than the foregoing diamine compound, amidine compound, azole compound, pyrazine compound and pyrimidine compound. Examples of the other organic amine include a monoamine compound and a polyamine compound.

Examples of the monoamine compound include an alkanolamine having at least one hydroxylalkyl group in the molecule, and a monoamine compound having at least one alkyl group in the molecule and having no hydroxylalkyl group.

Examples of the alkanolamine include monoethanolamine, diethanolamine, triethanolamine, diethylene glycol amine, and N-hydroxyethyl piperazine.

Examples of the monoamine compound other than the alkanolamine include ethylamine, benzylamine, diethylamine, n-butylamine, 3-methoxypropylamine, tert-butylamine, n-hexylamine, cyclohexylamine, n-octylamine, 2-ethylhexylamine, and pyridine.

For the monoamine compound, the compounds described in paragraphs [0034] to [0056] of the description of WO 2013/162020 can be applied, and the contents thereof are incorporated in the present description.

A polyamine compound having three or more amino groups in the molecule refers to a compound having a polyamine structure in which three amino groups are bonded by at least one organic group selected from the group consisting of linear or branched aliphatic hydrocarbon groups, alicyclic hydrocarbon groups and aromatic groups, and the combinations thereof, exclusive of the foregoing diamine compound, amidine compound, azole compound, pyrazine compound and pyrimidine compound.

Examples of the polyamine compound having three or more amino groups in the molecule include carbohydrazide.

For the organic amine, the compounds described in paragraphs [0037] to [0040] of JP 2017-524249 A and paragraphs [0023] to [0029] of JP 2018-107353 A can be applied, and the contents thereof are incorporated in the present description.

The organic amines may be used singly or in combination of two or more.

For the organic amine contained in the second liquid, the diamine compound, the amidine compound, the azole compound, the pyrazine compound, or the pyrimidine compound is preferred, the diamine compound represented by Formula (2) above, the amidine compound represented by Formula (3) above, the azole compound represented by Formula (4) above, or the compound represented by Formula (5) above is more preferred, and the diamine compound represented by Formula (2) above is even more preferred.

(Hydroxylamine Compound)

The second liquid may contain a hydroxylamine compound as the basic compound.

In the present description, the hydroxylamine compound refers to at least one selected from the group consisting of hydroxylamine ($NH_2OH$), a hydroxylamine derivative, and their salts.

The hydroxylamine derivative refers to a compound of hydroxylamine ($NH_2OH$) obtained through substitution with at least one organic group.

The organic group is not particularly limited as long as it is a group having at least one carbon atom, and examples thereof include linear or branched aliphatic hydrocarbon groups, alicyclic hydrocarbon groups and aromatic groups, and the combinations thereof.

A salt of hydroxylamine or a hydroxylamine derivative may be an inorganic or organic acid salt of hydroxylamine or a hydroxylamine derivative. For the salt of hydroxylamine or a hydroxylamine derivative, preferred is a salt thereof with an inorganic acid in which at least one non-metal selected from the group consisting of Cl, S, N and P is bonded to hydrogen, and more preferred is hydrochloride, sulfate, or nitrate.

One example of the hydroxylamine compound is a compound represented by Formula (6).

[Chemical Formula 17]

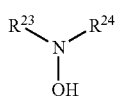

(6)

In the formula, $R^{23}$ represents a hydrogen atom or an alkyl group having 1 to 6 carbon atoms.

$R^{24}$ represents a hydrogen atom or an alkyl group having 1 to 6 carbon atoms.

The alkyl group having 1 to 6 carbon atoms represented by $R^{23}$ and $R^{24}$ may be any of linear, branched and cyclic groups. Specific examples of the alkyl group having 1 to 6 carbon atoms represented by $R^{23}$ and $R^{24}$ include the groups listed as the specific examples of the alkyl group having 1 to 6 carbon atoms in the alkoxycarbonyl group represented by $R^1$ to $R^3$ in Formula (1).

For the alkyl group having 1 to 6 carbon atoms represented by $R^{23}$ and $R^{24}$, an ethyl group or an n-propyl group is preferred, and an ethyl group is more preferred.

For $R^{24}$, an alkyl group having 1 to 6 carbon atoms is preferred, an ethyl group or an n-propyl group is more preferred, and an ethyl group is even more preferred.

Examples of the compound represented by Formula (6) include hydroxylamine, N-methylhydroxylamine, N,N-dimethylhydroxylamine, N-ethylhydroxylamine, N,N-diethylhydroxylamine (DEHA), N-n-propylhydroxylamine, N,N-di-n-propylhydroxylamine, N-isopropylhydroxylamine, N,N-diisopropylhydroxylamine, N-n-butylhydroxylamine, N,N-di-n-butylhydroxylamine, N-isobutylhydroxylamine, N,N-diisobutylhydroxylamine, N-sec-butylhydroxylamine, N,N-di-sec-butylhydroxylamine, N-tert-butylhydroxylamine, N,N-di-tert-butylhydroxylamine, N-cyclobutylhydroxylamine, N,N-dicyclobutylhydroxylamine, N-n-pentylhydroxylamine, N,N-di-n-pentylhydroxylamine, N-isopentylhydroxylamine, N,N-diisopentylhydroxylamine, N-sec-pentylhydroxylamine, N,N-di-sec-pentylhydroxylamine, N-tert-pentylhydroxylamine, N,N-di-tert-pentylhydroxylamine, N-neopentylhydroxylamine, N,N-dineopentylhydroxylamine, N-2-methylbutylhydroxylamine, N,N-bis(2-methylbutyl)hydroxylamine, N-1,2-dimethylpropylhydroxylamine, N,N-bis(1,2-dimethylpropyl) hydroxylamine, N-1-ethylpropylhydroxylamine, N,N-bis(1-ethylpropyl)hydroxylamine, N-cyclopentylhydroxylamine, N,N-dicyclopentylhydroxylamine, N-n-hexylhydroxylamine, N,N-di-n-hexylhydroxylamine, N-isohexylhydroxylamine, N,N-diisohexylhydroxylamine, N-sec-hexylhydroxylamine, N,N-di-sec-hexylhydroxylamine, N-tert-hexylhydroxylamine, N,N-di-tert-hexylhydroxylamine, N-neohexylhydroxylamine, N,N-dineohexylhydroxylamine, N-2-methylpentylhydroxylamine, N,N-bis(2-methylpentyl)hydroxylamine, N-1,2-dimethylbutylhydroxylamine, N,N-bis(1,2-dimethylbutyl)hydroxylamine, N-2,3-dimethylbutylhydroxylamine, N,N-bis(2,3-dimethylbutyl)hydroxylamine, N-1-ethylbutylhydroxylamine, N,N-bis(1-ethylbutyl)hydroxylamine, N-cyclohexylhydroxylamine, and N,N-dicyclohexylhydroxylamine.

Of these, N-ethylhydroxylamine, N,N-diethylhydroxylamine, or N-n-propylhydroxylamine is preferred, N,N-diethylhydroxylamine or N-n-propylhydroxylamine is more preferred, and N,N-diethylhydroxylamine is even more preferred. This is because those compounds are easily available and also make it possible to reduce a divalent copper oxide such as copper(II) oxide or copper(II) hydroxide to copper(I) oxide, thus protecting a surface of a copper-containing wiring film with a metal oxide constituted of the copper(I) oxide, thereby suppressing corrosion of the copper-containing wiring film and improving temporal stability of the copper-containing wiring film in a semiconductor substrate.

The hydroxylamine compounds may be used singly or in combination of two or more. As the hydroxylamine compound, a commercial product or a composite obtained by a known method may be used.

(Quaternary Ammonium Compound)

The second liquid may contain a quaternary ammonium compound as the basic compound.

The quaternary ammonium compound is not particularly limited as long as it is a quaternary ammonium cation-containing compound in which a nitrogen atom is attached to four hydrocarbon groups (preferably, alkyl groups) through substitution. Examples of the quaternary ammonium compound include quaternary ammonium hydroxide, quaternary ammonium fluoride, quaternary ammonium bromide, quaternary ammonium iodide, acetate of quaternary ammonium, and carbonate of quaternary ammonium, with quaternary ammonium hydroxide being preferred.

One example of the quaternary ammonium compound is a compound represented by Formula (7):

(7)

In the formula, $R^{25}$ represents an alkyl group that may have a hydroxyl group or a phenyl group as a substituent. Four $R^{25}$s may be the same or different.

For the alkyl group represented by $R^{25}$, an alkyl group having 1 to 4 carbon atoms is preferred, and a methyl group or an ethyl group is more preferred.

For the alkyl group that may have a hydroxyl group or a phenyl group as represented by $R^{25}$, preferred is a methyl group, an ethyl group, a propyl group, a butyl group, a 2-hydroxyethyl group, or a benzyl group, more preferred is a methyl group, an ethyl group, a propyl group, a butyl group, or a 2-hydroxyethyl group, and even more preferred is a methyl group, an ethyl group, or a 2-hydroxyethyl group.

Examples of the compound represented by Formula (7) include tetramethylammonium hydroxide (TMAH), tetraethylammonium hydroxide (TEAH), tetrapropylammonium hydroxide (TPAH), tetrabutylammonium hydroxide (TBAH), 2-hydroxyethyl trimethylammonium hydroxide (choline), bis(2-hydroxyethyl) dimethylammonium hydroxide, tri(2-hydroxyethyl)methylammonium hydroxide, tetra (2-hydroxyethyl)ammonium hydroxide, benzyltrimethylammonium hydroxide (BTMAH), and cetyltrimethylammonium hydroxide.

As other examples of the quaternary ammonium compound than the foregoing specific examples, the compounds described in paragraph [0021] of JP 2018-107353 A can be applied, and the contents thereof are incorporated in the present description.

Of these, TMAH, TEAH, TPAH, TBAH, choline, or bis(2-hydroxyethyl)dimethylammonium hydroxide is preferred, and choline is more preferred.

(Basic Inorganic Compound)

The second liquid may contain a basic inorganic compound. Examples of the basic inorganic compound include an alkali metal hydroxide, an alkaline earth metal hydroxide, and ammonia.

Examples of the alkali metal hydroxide include lithium hydroxide, sodium hydroxide, potassium hydroxide, and cesium hydroxide. Examples of the alkaline earth metal hydroxide include calcium hydroxide, strontium hydroxide, and barium hydroxide.

The second liquid may contain, other than the foregoing compounds, at least one selected from the group consisting of nitro, nitroso, oxime, ketoxime, aldoxime, nitrone, lactam, isocyanide compounds, and urea, as the basic compound.

The basic compounds may be contained in the second liquid singly or in combination of two or more.

For the basic compound, preferred is the use of at least one selected from the group consisting of the organic amine, the hydroxylamine compound, and the quaternary ammonium compound as above, more preferred is the use of a combination of at least two thereof, and even more preferred is the use of all of the three in combination.

Those basic compounds for use may be commercial products or composites obtained by a known method.

<Acidic Compound>

An acidic compound is contained in at least one of the first liquid and the second liquid.

It is preferable that the acidic compound be contained in at least the first liquid because this leads to more excellent impurity removal performance when the prepared cleaning agent is applied to a surface of a semiconductor substrate having undergone the CMP process.

The acidic compound may be an organic acid or an inorganic acid, and an organic acid is preferred because this leads to more excellent performance of removing metal impurities on a surface of a semiconductor substrate and preventing metal corrosion.

(Organic Acid)

The organic acid is an organic compound having an acidic functional group and showing acidic properties (pH: less than 7.0) in an aqueous solution. Examples of the acidic functional group include a carboxyl group, a phosphonic acid group, a sulfo group, a phenolic hydroxyl group, and a mercapto group.

The number of the functional groups of the organic acid is not particularly limited, and is preferably 1 to 4 and more preferably 1 to 3.

The organic acid is not particularly limited, and examples thereof include a carboxylic acid having a carboxyl group in the molecule (organic carboxylic acid), a phosphonic acid having a phosphonic acid group in the molecule (organic phosphonic acid), and a sulfonic acid having a sulfo group in the molecule (organic sulfonic acid); a carboxylic acid is preferred because this has the chelate effect on copper and its alloys and leads to more excellent impurity removal performance.

—Carboxylic Acid—

The carboxylic acid may be a monocarboxylic acid having one carboxyl group or a polycarboxylic acid having two or more carboxyl groups. Preferred is a polycarboxylic acid having two or more (preferably two to four, more preferably two or three) carboxyl groups because this leads to more excellent performance of removing impurities on a surface of a semiconductor substrate.

Specific examples of the carboxylic acid include lactic acid, citric acid, formic acid, oxalic acid, acetic acid, propionic acid, malonic acid, succinic acid, glutaric acid, maleic acid, fumaric acid, phthalic acid, glycolic acid, salicylic acid, tartaric acid, malic acid, valeric acid, isovaleric acid, 1,2,3-benzenetricarboxylic acid, gluconic acid, diglycolic acid, acetohydroxamic acid, benzohydroxamic acid, salicylhydroxamic acid, phthalhydroxamic acid, benzoic acid, and dihydroxybenzoic acid.

Other examples of the carboxylic acid than the foregoing specific examples include unsaturated carboxylic acids such as sorbic acid.

As the carboxylic acid, an amino acid may be used. Examples of the amino acid include alanine, aspartic acid, cysteine, glutamine, glycine, isoleucine, leucine, methionine, phenylalanine, proline, serine, threonine, tryptophan, tyrosine, valine, asparagine, glutamic acid, arginine, histidine, and lysine.

For the amino acid, the compounds described in paragraph [0021] of JP 2016-086094 A can be applied, and the contents thereof are incorporated in the present description.

For the carboxylic acid, those described in paragraph [0059] of WO 2013/162020 and paragraphs [0014] to [0040] of JP 3219020 B can also be applied, and the contents thereof are incorporated in the present description.

For the carboxylic acid, preferred is lactic acid, citric acid, formic acid, oxalic acid, acetic acid, propionic acid, malonic acid, succinic acid, glutaric acid, maleic acid, fumaric acid, phthalic acid, glycolic acid, salicylic acid, tartaric acid, or malic acid.

For the carboxylic acid, because of higher performance of removing impurities on a surface of a semiconductor substrate and further preventing metal corrosion, a hydroxy carboxylic acid having one or more hydroxyl groups is preferred, and a hydroxy carboxylic acid represented by Formula (8) is more preferred.

[Chemical Formula 18]

(8)

In the formula, $R^{26}$ represents a carboxyl group, a 1,2,3-trihydroxypropyl group, or a 3-oxo-1,2-dihydroxypropyl group.

For $R^{26}$, a carboxyl group is preferred.

Specific examples of the hydroxy carboxylic acid represented by Formula (8) include tartaric acids (e.g., D-tartaric acid, L-tartaric acid, and meso-tartaric acid), 2,3,4,5,6-pentahydroxyhexanoic acids (e.g., gluconic acid), and 6-oxo-2,3,4,5-tetrahydroxyhexanoic acids (e.g., galacturonic acid), with tartaric acids being preferred because of availability and more excellent performance of removing fine abrasive particles, metal impurities and a protection film.

—Phosphonic Acid—

The phosphonic acid may be a monophosphonic acid having one phosphonic acid group or a polyphosphonic acid having two or more phosphonic acid groups. Preferred is a polyphosphonic acid having two or more (preferably two to four, more preferably two or three) phosphonic acid groups because this leads to more excellent performance of removing impurities on a surface of a semiconductor substrate.

For the phosphonic acid, phosphonic acids described in paragraphs [0013] to [0031] of the description of WO 2013/162020 can be applied, and the contents thereof are incorporated in the present description.

For the phosphonic acid, 1-hydroxyethylidene-1,1'-diphosphonic acid [HEDPO] is preferred.

Of phosphonic acids, those compounds that have the functions of a chelating agent to be described later are defined as belonging to both the organic acid and the chelating agent.

—Sulfonic Acid—

The sulfonic acid may be a monosulfonic acid having one sulfonic acid group or a polysulfonic acid having two or more sulfonic acid groups.

Specific examples of the sulfonic acid include methanesulfonic acid, ethanesulfonic acid, propanesulfonic acid, and butanesulfonic acid.

The organic acids may be used singly or in combination of two or more.

(Inorganic Acid)

As the acidic compound, an inorganic acid may be used. Examples of the inorganic acid include phosphoric acid, boric acid, and hexafluorophosphoric acid. Salts of the inorganic acids may also be used, and examples thereof include ammonium salts of the inorganic acids, more specifically, ammonium phosphate, ammonium borate, and ammonium hexafluorophosphate.

For the inorganic acid, phosphoric acid or a phosphate is preferred, and phosphoric acid is more preferred.

As the acidic compound, a derivative such as a salt or an ester of the acidic compound may be used as long as it forms an acid or an acid ion (anion) in an aqueous solution. As the acidic compound, a commercial product or a composite obtained by a known method may be used.

The acidic compounds may be used singly or in combination of two or more.

<Water>

The cleaning agent preferably contains water as a solvent and more preferably is an aqueous solution in which each component is dissolved in water. Likewise, each of the first and second liquids used to prepare the cleaning agent preferably contains water as a solvent and more preferably is an aqueous solution in which each component is dissolved in water.

The type of water used in the cleaning agent and the first and second liquids is not particularly limited as long as its influence on a semiconductor substrate is small. Examples of the water include distilled water, deionized water, and ultrapure water, and ultrapure water is preferred because it hardly contains impurities and its influence on a semiconductor substrate is smaller in a semiconductor substrate manufacturing process.

(Additive)

The cleaning agent may also optionally contain other additives than the foregoing components. Examples of such additives include a surfactant, a chelating agent, a water-soluble polymer, a stabilizer, and a buffering agent.

(Surfactant)

The cleaning agent may contain a surfactant. The use of the surfactant can improve the removability of fine abrasive particles and the performance of preventing metal corrosion.

Examples of the surfactant include anionic surfactants, nonionic surfactants, and amphoteric surfactants.

Exemplary anionic surfactants include an anionic surfactant having a carboxyl group in the molecule, an anionic surfactant having a sulfonic acid group in the molecule, an anionic surfactant having a sulfate group in the molecule, and an anionic surfactant having a phosphonic acid group in the molecule.

Examples of the anionic surfactant having a carboxyl group in the molecule include a sodium alkyl carboxylate, a potassium alkyl carboxylate, an ammonium alkyl carboxylate, a sodium alkyl benzene carboxylate, a potassium alkyl benzene carboxylate, an ammonium alkyl benzene carboxylate, a sodium polyoxyalkylene alkyl ether carboxylate, a potassium polyoxyalkylene alkyl ether carboxylate, an ammonium polyoxyalkylene alkyl ether carboxylate, a sodium N-acyl sarcosinate, a potassium N-acyl sarcosinate, an ammonium N-acyl sarcosinate, a sodium N-acyl glutamate, a potassium N-acyl glutamate, and an ammonium N-acyl glutamate.

Examples of the anionic surfactant having a sulfonic acid group in the molecule include a sodium alkyl sulfonate, a potassium alkyl sulfonate, an ammonium alkyl sulfonate, an alkyl benzene sulfonic acid (e.g., dodecylbenzenesulfonic acid), a sodium alkyl benzene sulfonate (e.g., sodium dodecylbenzenesulfonate), a potassium alkyl benzene sulfonate (e.g., potassium dodecylbenzenesulfonate), an ammonium alkyl benzene sulfonate (e.g., ammonium dodecylbenzenesulfonate), a sodium alkyl naphthalene sulfonate, a potassium alkyl naphthalene sulfonate, an ammonium alkyl naphthalene sulfonate, a sodium polyoxyalkylene alkyl ether sulfonate, a potassium polyoxyalkylene alkyl ether sulfonate, an ammonium polyoxyalkylene alkyl ether sulfonate, an N-methyl-N-acyl taurine sodium salt, an N-methyl-N-acyl taurine potassium salt, an N-methyl-N-acyl taurine ammonium salt, a sodium dialkyl sulfosuccinate (e.g., sodium dioctyl sulfosuccinate), a potassium dialkyl sulfosuccinate (e.g., potassium dioctyl sulfosuccinate), and an ammonium dialkyl sulfosuccinate (e.g., ammonium dioctyl sulfosuccinate).

Examples of the anionic surfactant having a sulfate group in the molecule include a sodium alkyl sulfate (e.g., sodium lauryl sulfate), a potassium alkyl sulfate (e.g., potassium lauryl sulfate), and an ammonium alkyl sulfate (e.g., ammonium lauryl sulfate).

Examples of the anionic surfactant having a phosphonic acid group in the molecule include a sodium alkyl phosphonate, a potassium alkyl phosphonate, an ammonium alkyl phosphonate, a sodium alkyl benzene phosphonate, a potassium alkyl benzene phosphonate, an ammonium alkyl benzene phosphonate, a sodium polyoxyalkylene alkyl ether phosphonate, a potassium polyoxyalkylene alkyl ether phosphonate, and an ammonium polyoxyalkylene alkyl ether phosphonate.

Exemplary nonionic surfactants include a polyoxyalkylene alkyl ether (e.g., polyoxyethylene stearyl ether), a polyoxyalkylene alkenyl ether (e.g., polyoxyethylene oleyl ether), a polyoxyethylene alkyl phenyl ether (e.g., polyoxyethylene nonyl phenyl ether), a polyoxyalkylene glycol (e.g., polyoxypropylene polyoxyethylene glycol), a polyoxyalkylene monoalkylate (e.g., polyoxyethylene monostearate), a bispolyoxyalkylene alkylamide (e.g., bispolyoxyethylene stearylamide), a polyoxyethylene fatty acid ester, a sorbitan fatty acid ester, a polyoxyethylene sorbitan fatty acid ester, a polyoxyethylene alkylamine, a glycerine fatty acid ester, an oxyethylene-oxypropylene block copolymer, an acetylene glycol-based surfactant, and an acetylene-based polyoxyethylene oxide.

Specific examples of the nonionic surfactant also include the compounds described in paragraph 0095 of JP 2015-158662, and the contents thereof are incorporated in the present description.

Exemplary amphoteric surfactants include a carboxybetaine (e.g., an alkyl-N,N-dimethylaminoacetic acid betaine, an alkyl-N,N-dihydroxyethylaminoacetic acid betaine), a sulfobetaine (e.g., an alkyl-N,N-dimethylsulfoethylene ammonium betaine), an imidazolinium betaine (e.g., a 2-alkyl-N-carboxymethyl-N-hydroxyethylimidazolinium betaine), and an alkylamine oxide (e.g., an N,N-dimethylalkylamine oxide).

For the surfactant, the compounds described in paragraph [0061] of WO 2013/162020, paragraphs [0092] to [0096] of JP 2015-158662 A, paragraphs [0045] to [0046] of JP 2012-151273 A, and paragraphs [0014] to [0020] of JP 2009-147389 A can be applied, and the contents thereof are incorporated in the present description.

Those surfactants may be used singly or in combination of two or more. Commercial products may be used as those surfactants.

(Chelating Agent)

The cleaning agent may contain a chelating agent. Examples of the chelating agent include glycerol, aminopolycarboxylic acid compounds such as ethylenediaminetetraacetic acid [EDTA], and trans-1,2-diaminocyclohexanetetraacetic acid [CyDTA], phosphonic acid compounds such as ethylenediaminetetra (methylenephosphonic acid) [EDTPO], ethylenediaminedi (methylenephosphonic acid) [EDDPO], nitrilotris (methylenephosphonic acid) [NTPO], and 1-hydroxyethylidene-1,1'-diphosphonic acid [HEDPO], condensed phosphoric acid compounds such as tripolyphosphoric acid, and hexametaphosphoric acid, diketone compounds such as acetylacetone, and hexafluoroacetylacetone, and inorganic ions such as halide ions ($F^-$, $Cl^-$, $Br^-$, $I^-$), cyanide ion, thiocyanate ion, thiosulfate ion, and ammonium ion. For the chelating agent, the phosphonic acid compounds are preferred.

The chelating agents may be used singly or in combination of two or more.

For the chelating agent, the phosphonic acid-based chelating agents described in paragraphs [0031] to [0032] of WO 2013/162020 and paragraphs [0030] to [0031] of JP 2013-119579 A and the compounds described in the description of WO 2004/042811 can be applied, and the contents thereof are incorporated in the present description.

(Water-Soluble Polymer)

The cleaning agent may contain a water-soluble polymer. For the water-soluble polymer, the compounds described in paragraphs [0043] to [0047] of JP 2016-171294 can be applied, and the contents thereof are incorporated in the present description.

(Stabilizer)

The cleaning agent may contain a stabilizer against additive components such as an amine compound.

(Buffering Agent)

The cleaning agent may contain a buffering agent. Examples of the buffering agent include boric acid, guanidine carbonate, and Good's buffers known as buffering agents for biochemical use. For the Good's buffer, preferred is for example N,N-bis(2-hydroxyethyl)glycine (Bicine), N-cyclohexyl-3-aminopropanesulfonic acid (CAPS), N-cyclohexyl-2-hydroxyl-3-aminopropanesulfonic acid (CAPSO), or N-cyclohexyl-2-aminoethanesulfonic acid (CHES), and more preferred is N-cyclohexyl-3-aminopropanesulfonic acid (CAPS) or N-Cyclohexyl-2-aminoethanesulfonic acid (CHES).

For the buffering agent, the compounds described in paragraph [0034] of JP 2007-19506 A and paragraph [0027] of JP 2005-101479 A can also be applied, and the contents thereof are incorporated in the present description.

The chelating agent, the water-soluble polymer, the stabilizer and the buffering agent may be contained in either of the first liquid and the second liquid. The amounts of the chelating agent, the water-soluble polymer, the stabilizer and the buffering agent to be used are also not particularly limited and may be specified in suitable ranges so as not to impair the effects of the invention.

[Structure of Kit]

The kit of the invention is a multi-liquid type kit for preparing a cleaning agent, the kit including at least the first liquid containing the component A and showing acidic properties and the second liquid containing the basic compound and showing alkaline properties.

In the kit of the invention, the component A is kept in a solution showing acidic properties, and the solution is mixed with the second liquid containing the basic compound to prepare a cleaning agent before use of the cleaning agent, which makes it possible to obtain the cleaning agent in which the performance of removing impurities on a surface of a semiconductor substrate having undergone the CMP process is maintained even after a long-term storage, unlike conventional single liquid-type cleaning agents, and excellent storage stability is shown.

An example of the semiconductor substrate having undergone the CMP process is not limited to but includes a substrate having undergone the CMP process described in Journal of the Japan Society for Precision Engineering, Vol. 84, No. 3, 2018.

<First Liquid>

The first liquid contains the component A. Preferably, the first liquid contains at least the component A and water.

The component A content of the first liquid is not particularly limited and is preferably 0.01 to 50 mass %, and because of more excellent performance of removing impurities on a surface of a semiconductor substrate, more preferably 0.1 to 30 mass % and even more preferably 0.2 to 20 mass % based on the total mass of the first liquid.

The water content of the first liquid is not particularly limited, and it suffices if the water content is the remainder except the component A and the optionally-contained acidic compound and surfactant.

The first liquid preferably contains the acidic compound because this leads to more excellent maintainability of the performance of removing impurities on a surface of a semiconductor substrate having undergone the CMP process.

When the first liquid contains the acidic compound, the acidic compound content is not particularly limited and is preferably 0.1 to 50 mass %, more preferably 1 to 40 mass % and even more preferably 2 to 30 mass % based on the total mass of the first liquid.

The first liquid may contain the surfactant. It is preferable for the first liquid to contain the surfactant because this leads to more excellent removability of fine abrasive particles and more excellent performance of preventing metal corrosion.

When the first liquid contains the surfactant, the surfactant content is not particularly limited and is preferably 0.001 to 20 mass %, more preferably 0.01 to 10 mass % and even more preferably 0.05 to 5 mass % based on the total mass of the first liquid.

The pH of the first liquid is not particularly limited as long as it is less than 7.0 and at least the pH of the cleaning agent obtained by mixing the first and second liquids is to be 7.5 to 13.0. The pH of the first liquid is preferably not more than 5.0, more preferably not more than 4.0, and even more preferably not more than 3.0 because this leads to more excellent maintainability of the performance of removing impurities on a surface of a semiconductor substrate having undergone the CMP process (i.e., more excellent stability of the cleaning agent). The lower limit of the pH of the first liquid is not particularly limited and is preferably not less than 0.5 for the sake of handleability of the liquid.

The method of adjusting the pH of the first liquid is not particularly limited; for instance, the pH may be adjusted by adding the acidic compound to the first liquid or adding another acid to the first liquid.

<Second Liquid>

The second liquid contains the basic compound. Preferably, the second liquid contains at least the basic compound and water.

The basic compound content of the second liquid is not particularly limited as long as the second liquid shows the basic property, and is preferably 0.111 to 60 mass %, more preferably 1.005 to 35 mass % and even more preferably 1.505 to 20 mass % based on the total mass of the second liquid.

The water content of the second liquid is not particularly limited, and it suffices if the water content is the remainder except the basic compound and the optionally-contained acidic compound and surfactant.

When the second liquid contains the organic amine, the organic amine content is preferably 0.001 to 20 mass %, more preferably 0.005 to 10 mass % and even more preferably 0.005 to 5 mass % based on the total mass of the second liquid.

When the second liquid contains the hydroxylamine compound, the hydroxylamine compound content is preferably 0.01 to 20 mass %, more preferably 0.5 to 10 mass % and even more preferably 0.5 to 5 mass % based on the total mass of the second liquid.

When the second liquid contains the quaternary ammonium compound, the quaternary ammonium compound content is preferably 0.1 to 20 mass %, more preferably 0.5 to 15 mass % and even more preferably 1 to 10 mass % based on the total mass of the second liquid.

The second liquid may contain the acidic compound. It is preferable for the second liquid to contain the acidic compound because this facilitates desired pH adjustment.

When the second liquid contains the acidic compound, the acidic compound content is not particularly limited as long as the second liquid shows the basic property, and is preferably 0.001 to 5 mass % and more preferably 0.01 to 1 mass % based on the total mass of the second liquid.

The second liquid may contain the surfactant. It is preferable for the second liquid to contain the surfactant because this leads to more excellent removability of fine abrasive particles and more excellent performance of preventing metal corrosion.

When the second liquid contains the surfactant, the surfactant content is preferably 0.001 to 20 mass %, more preferably 0.01 to 10 mass % and even more preferably 0.05 to 5 mass % based on the total mass of the second liquid.

The pH of the second liquid is not particularly limited as long as it is more than 7.0 and at least the pH of the cleaning agent obtained by mixing the first and second liquids is to be 7.5 to 13.0. The pH of the second liquid is preferably not less than 7.5 and more preferably not less than 8.0. The upper limit of the pH of the second liquid is not particularly limited and is preferably not more than 14.0.

The method of adjusting the pH of the second liquid is not particularly limited; for instance, the pH may be adjusted based on the amount of the basic compound (particularly, the quaternary ammonium compound) contained in the second liquid.

<Third Liquid>

The kit may further include, in addition to the first and second liquids, a third liquid containing at least water.

The third liquid may contain water only or at least one selected from the group consisting of the acidic compound and the surfactant.

When the third liquid contains the acidic compound, the acidic compound content is preferably 000.1 to 20 mass % based on the total mass of the third liquid.

When the third liquid contains the surfactant, the surfactant content is preferably 0.001 to 20 mass % based on the total mass of the third liquid.

The kit may be a four or more liquid type kit that further includes at least a fourth liquid in addition to the first, second and third liquids.

Preferred is a two liquid type kit including the first and second liquids or a three liquid type kit including the first, second and third liquids because the process for manufacturing the cleaning agent is simpler.

<Metal Concentration>

In each liquid included in the kit, the ion concentration of each of metals (elemental metals such as Co, K, Cu, Mg, Mn, Li, Al, Ni and Zn) contained as impurities in the relevant liquid (hereinafter also simply called "metal concentration") is preferably not more than 5 ppm by mass and more preferably not more than 1 ppm by mass. Since it is expected in manufacture of leading-edge semiconductors that a cleaning agent with even higher purity should be required, the metal concentration is still more preferably less than 1 ppm by mass, that is, a value on the order of ppb by mass or less, and particularly preferably a value on the order of ppt by mass. It is most preferable that each liquid included in the kit be substantially free from metal components.

Exemplary methods of reducing the metal concentration include refining treatments such as distillation and filtration using ion-exchange resin or a filter in at least one of the stage of raw materials to be used in preparation of each of the foregoing liquids and the stage after each of the foregoing liquids has been prepared.

Another method of reducing the metal concentration is the one using, as a container storing a raw material to be used in production of the kit, a container from which impurities are not largely leached, which will be described later. Still another method is providing lining of fluororesin on inner walls of pipes used in production of the kit in order to prevent metal components from being leached from the pipes.

[Production of Kit]

The method of producing the kit is not particularly limited. For instance, the kit for preparing a cleaning agent may be produced by preparing the first liquid, the second liquid, and optionally the third liquid and then putting those liquids in separate containers.

The method of preparing the first liquid is not particularly limited. For instance, one method involves adding the component A, as well as the acidic compound and the surfactant that are optional components, to ultrapure water from which dissolved oxygen has been removed, followed by stirring, thus preparing the first liquid as a uniform aqueous solution.

The methods of preparing the second and third liquids are also not particularly limited, and the preparation may be carried out according to the method of preparing the first liquid.

A stirrer and a stirring method used in preparation of the first to third liquids are not particularly limited, and a known device may be used as the stirrer or a disperser. Examples of the stirrer include an industrial mixer, a portable stirrer, a mechanical stirrer, and a magnetic stirrer. Examples of the disperser include an industrial disperser, a homogenizer, an ultrasonic disperser, and a bead mill.

In production of the kit, it is preferable to previously carry out a refining treatment on one or more of raw materials to be used in preparation of the respective liquids to be included in the kit. The refining treatment is not particularly limited, and examples thereof include known methods such as distillation, ion exchange, and filtration.

The degree of refining is not particularly limited, and a raw material is refined to a purity of preferably not less than 99 mass % and more preferably not less than 99.9 mass %.

Examples of specific methods of the refining treatment include a method in which a raw material is passed through ion-exchange resin or a RO membrane (Reverse Osmosis Membrane), distillation of a raw material, and filtration to be described later.

As the refining treatment, the foregoing refining methods may be used in combination of two or more. For instance, a raw material may be firstly subjected to primary refinement in which a liquid is passed through a RO membrane and then to secondary refinement in which the liquid is passed through a refinement device made of cation exchange resin, anion exchange resin, or mixed-bed ion exchange resin. The refining treatment may be carried out plural times.

(Filtration)

A filter used in filtration is not particularly limited as long as it is of a type that has been conventionally used for filtration. Examples of the filter include filters made of fluororesins such as polytetrafluoroethylene (PTFE) and tetrafluoroethylene-perfluoroalkylvinylether copolymer (PFA), polyamide resins such as nylon, and polyolefin resins (including high density one and ultra high molecular weight one) such as polyethylene and polypropylene (PP). Preferred is a filter made of, of the above materials, a material selected from the group consisting of polyethylene, polypropylene (including high density polypropylene), fluororesin (including PTFE and PFA), and polyamide resin (including nylon), and more preferred is a filter made of fluororesin. By filtering a raw material with the filter made of such a material, foreign matter with high polarity that easily causes defects can be effectively removed from the first to third liquids to be included in the kit.

The filter has a critical surface tension of preferably 70 to 95 mN/m and more preferably 75 to 85 mN/m. It should be noted that the value of the critical surface tension of the filter is a nominal value provided by its manufacturer. The use of the filter having a critical surface tension within the above ranges makes it possible to effectively remove foreign matter with high polarity that easily causes defects.

The filter has a pore size of preferably 2 to 20 nm and more preferably 2 to 15 nm. The pore size within the above ranges makes it possible to reliably remove fine foreign matter such as impurities and agglomerates contained in a raw material, while preventing clogging in filtration.

Different filters may be combined for filtration. In this case, filtration with a first filter may be carried out only one time or two or more times. When different filters are combined to carry out filtration two or more times, the pore size in the second and subsequent filtrations is preferably equal to or smaller than that in the first filtration. Alternatively, the first filters having different pore sizes within the above ranges may be combined. The pore size of a filter can be identified by reference to a nominal value of the filter manufacturer.

In terms of commercial products, a filter may be selected from various filters provided by, for example, Nihon Pall Ltd., Advantec Toyo Kaisha, Ltd., Entegris Japan Co., Ltd. (formerly Nippon Microlith Co., Ltd.), and Kitz Microfilter Corporation. Further, "P-Nylon filter (pore size: 0.02 μm, critical surface tension: 77 mN/m)" made of polyamide (manufactured by Nihon Pall Ltd.), "PE-Kleen filter (pore size: 0.02 μm)" made of high-density polyethylene (manufactured by Nihon Pall Ltd.), and "PE-Kleen filter (pore size: 0.01 μm)" made of high-density polyethylene (manufactured by Nihon Pall Ltd.) may also be used.

As a second filter, a filter made of a material same as or similar to that of the first filter may be used. The second filter preferably has a pore size of 1 to 10 nm.

Filtration is carried out preferably at room temperature (25° C.) or lower, more preferably at 23° C. or lower, and even more preferably at 20° C. or lower, and at the same time, preferably at 0° C. or higher, more preferably at 5° C. or higher, and even more preferably at 10° C. or higher. Filtration at a temperature within the foregoing ranges makes it possible to reduce the amounts of particulate foreign matter and impurities dissolved in a raw material and effectively remove foreign matter and impurities.

<Container (Storage Container)>

Each liquid to be included in the kit can be put into a given container and stored, transported and used as long as problems such as corrosion do not occur.

For the container, preferred is a container which has high cleanliness in its interior and in which leaching of impurities from the inner wall of an accommodating portion of the container to each liquid are suppressed, for semiconductor applications. Examples of such a container include various containers commercially available as containers for semiconductor cleaning agents, as exemplified by, but not limited to, the "Clean Bottle" series manufactured by Aicello Corporation and "Pure Bottle" manufactured by Kodama Plastics Co., Ltd.

For the container storing each liquid to be included in the kit, preferred is a container whose portion to contact each liquid, such as the inner wall of its accommodating portion, is formed from fluororesin (perfluororesin) or metal having undergone a rust proof and metal leaching prevention treatment.

The inner wall of the container is preferably formed from one or more resins selected from the group consisting of polyethylene resin, polypropylene resin, and polyethylene-polypropylene resin, or another resin different therefrom, or a metal having undergone a rust proof and metal leaching prevention treatment, such as stainless steel, Hastelloy, Inconel, or Monel.

For another resin above, fluororesin (perfluororesin) is preferred. When such a container with its inner wall being formed from fluororesin is used, defects such as leaching of oligomers of ethylene or propylene can be suppressed as compared to a container with its inner wall being formed from polyethylene resin, polypropylene resin, or polyethylene-polypropylene resin.

Specific examples of such a container with its inner wall being formed from fluororesin include FluoroPure PFA composite drums manufactured by Entegris, Inc. In addition, the containers described in page 4 of JP 3-502677 A, page 3 of WO 2004/016526, and pages 9 and 16 of WO 99/46309 may also be used.

In addition to the foregoing fluororesin, quartz and an electrolytically polished metal material (i.e., a metal material having undergone electrolytic polishing) may also be preferably used for the inner wall of a container.

For a metal material used in manufacture of the electrolytically polished metal material, preferred is a metal material containing at least one selected from the group consisting of chromium and nickel, with the total content of chromium and nickel being more than 25 mass % based on the total mass of the metal material. Examples of such a metal material include stainless steel and a nickel-chromium alloy.

The total content of chromium and nickel in the metal material is more preferably not less than 30 mass % based on the total mass of the metal material.

The upper limit of the total content of chromium and nickel in the metal material is not particularly limited and is preferably not more than 90 mass %.

The type of the stainless steel is not particularly limited, and any known stainless steels may be used. In particular, an alloy containing not less than 8 mass % of nickel is preferred, and austenitic stainless steel containing not less than 8 mass % of nickel is more preferred. Examples of the austenitic stainless steel include SUS (Steel Use Stainless) 304 (Ni content: 8 mass %, Cr content: 18 mass %), SUS 304L (Ni content: 9 mass %, Cr content: 18 mass %), SUS 316 (Ni content: 10 mass %, Cr content: 16 mass %), and SUS 316L (Ni content: 12 mass %, Cr content: 16 mass %).

The type of the nickel-chromium alloy is not particularly limited, and any known nickel-chromium alloys may be used. In particular, a nickel-chromium alloy with a nickel content of 40 to 75 mass % and a chromium content of 1 to 30 mass % is preferred.

Examples of the nickel-chromium alloy include Hastelloy (commercial name, hereinafter the same), Monel (commercial name, hereinafter the same), and Inconel (commercial name, hereinafter the same), and more specifically, Hastelloy C-276 (Ni content: 63 mass %, Cr content: 16 mass %), Hastelloy-C(Ni content: 60 mass %, Cr content: 17 mass %), and Hastelloy C-22 (Ni content: 61 mass %, Cr content: 22 mass %).

The nickel-chromium alloy may optionally further contain a metal selected from the group consisting of boron, silicon, tungsten, molybdenum, copper, and cobalt in addition to any of the foregoing alloys.

The method of electrolytic polishing of the metal material is not particularly limited, and any known methods may be used. For instance, the methods described in paragraphs [0011] to [0014] of JP 2015-227501 A and paragraphs [0036] to [0042] of JP 2008-264929 A may be used.

In regard to the metal material, probably, electrolytic polishing allows the chromium content of its passive layer at the surface to be higher than that of the matrix. Therefore, elemental metal does not easily flow out from the inner wall covered with the electrolytically polished metal material into each liquid to be included in the kit, and this should probably be the reason why the liquids and the cleaning agent with reduced amounts of metal impurities can be obtained.

The metal material is preferably subjected to buffing. The method of buffing is not particularly limited, and any known methods may be used. The size of abrasive grains used in buffing finishing is not particularly limited, and the size #400 or a smaller size is preferred because the asperities at a surface of the metal material can be reduced more easily.

Buffing is preferably carried out before electrolytic polishing.

The metal material may be subjected to one or a combination of two or more selected from buffing, pickling, and magnetorheological finishing, the buffing including plural stages carried out with varying grit numbers, e.g., varying sizes of abrasive grains.

Preferably, the inside of the containers is washed before being filled with the respective liquids. For a liquid used for washing, the amount of metal impurities in the liquid is preferably reduced. After being manufactured, the liquids to be included in the kit may be bottled in such containers as gallon bottles or quart bottles, and transported and stored.

In order to prevent the components in the liquids from changing during storage, the inside of each container may be replaced with an inert gas (e.g., nitrogen, argon) having a purity of not less than 99.99995 vol % in advance. In particular, a gas with a low moisture content is preferred. While the transportation and the storage may be carried out at normal temperature, the temperatures of the liquids may be controlled to fall within the range of −20° C. to 20° C. to prevent the properties of the components in the liquids from changing.

(Clean Room)

It is preferable to conduct all of production of the kit, opening and washing of the containers to store the liquids to be included in the kit, handling of the liquids such as filling, process and treatment analyses, and measurements in a cleanroom. The cleanroom preferably satisfies 14644-1 cleanroom standards. The cleanroom satisfies preferably one of ISO (International Organization for Standardization) Class 1, ISO Class 2, ISO Class 3, and ISO Class 4, more preferably ISO Class 1 or ISO Class 2, and even more preferably ISO Class 1.

[Cleaning Agent]

A cleaning agent for use in cleaning of a semiconductor substrate having undergone the CMP process is prepared by use of the kit. The cleaning agent contains at least the first liquid and the second liquid included in the kit.

[pH]

The cleaning agent prepared using the kit has a pH of 7.5 to 13.0 at 25° C. as a chemical solution during cleaning.

In the case where a cobalt-containing film is present on a surface of a semiconductor substrate, the pH of the cleaning agent is preferably not less than 8.0 and more preferably not less than 8.5 at 25° C. because this can further suppress corrosion of the cobalt-containing film. The upper limit of pH of the cleaning agent is preferably not more than 13.0, more preferably not more than 12.0, and even more preferably not more than 11.0 at 25° C. because this can further suppress galvanic corrosion between copper(I) oxide and cobalt(II) oxide that may occur when a copper-containing wiring film is in contact with the cobalt-containing film at the surface of the semiconductor substrate.

The pH of the cleaning agent may be adjusted based on the amounts of the basic compound (particularly, the quaternary ammonium compound) and the acidic compound contained in the second liquid.

[Content of Each Component]

The cleaning agent contains at least the component A, the basic compound, the acidic compound, and water, and optionally the surfactant and other additives.

The coating A content of the cleaning agent is preferably not less than 0.00005 mass %, more preferably not less than 0.0005 mass % and even more preferably not less than 0.001 mass % based on the total mass of the cleaning agent. The coating A content being within the foregoing ranges makes it possible to maintain the performance of removing impurities on a surface of a semiconductor substrate. The upper limit thereof is not particularly limited and is preferably not more than 2.5 mass %, more preferably not more than 1.5 mass % and even more preferably not more than 1.0 mass % based on the total mass of the cleaning agent because the amount of metal remaining on the surface of the semiconductor substrate can be further reduced due to formation of a complex.

The basic compound content of the cleaning agent is preferably not less than 0.001 mass %, more preferably not less than 0.01 mass % and even more preferably not less than 0.05 mass % based on the total mass of the cleaning agent because this can further suppress galvanic corrosion between copper(I) oxide and cobalt(II) oxide that may occur when a copper-containing wiring film is in contact with a cobalt-containing film at a surface of a semiconductor substrate. The upper limit thereof is not particularly limited and is preferably not more than 20 mass %, more preferably not more than 10 mass % and even more preferably not more than 5 mass % based on the total mass of the cleaning agent.

When the cleaning agent contains the organic amine, the organic amine content is preferably not less than 0.000005 mass % and more preferably not less than 0.000025 mass % based on the total mass of the cleaning agent because of higher performance of removing fine abrasive particles, metal impurities and a protection film. The upper limit thereof is not particularly limited and is preferably not more than 1 mass %, more preferably not more than 0.5 mass % and even more preferably not more than 0.25 mass % based on the total mass of the cleaning agent because the amount of copper remaining on the surface of the semiconductor substrate can be further reduced due to formation of a complex with copper derived from a copper-containing wiring film.

When the cleaning agent contains the hydroxylamine compound, the hydroxylamine compound content is preferably not less than 0.0005 mass % and more preferably not less than 0.0025 mass % based on the total mass of the cleaning agent because this leads to a higher effect to protect a surface of a copper-containing wiring film using a metal oxide constituted of copper(I) oxide and also this can further suppress corrosion of the copper-containing wiring film and a cobalt-containing film caused by oxygen remaining in the aqueous solution. The upper limit thereof is not particularly limited and is preferably not more than 1 mass %, more preferably not more than 0.5 mass % and even more preferably not more than 0.25 mass % based on the total mass of the cleaning agent because this leads to more excellent solubility in the aqueous solution.

When the cleaning agent contains the quaternary ammonium compound, the quaternary ammonium compound content is preferably 0.0005 to 1 mass %, more preferably 0.0025 to 0.75 mass % and even more preferably 0.005 to 0.5 mass % based on the total mass of the cleaning agent.

The acidic compound content of the cleaning agent is preferably not less than 0.0005 mass %, more preferably not less than 0.005 mass % and even more preferably not less than 0.01 mass % based on the total mass of the cleaning agent because of higher performance of removing fine abrasive particles, metal impurities and a protection film. The upper limit thereof is not particularly limited and is preferably not more than 2.5 mass %, more preferably not more than 2 mass % and even more preferably not more than 1.5 mass % based on the total mass of the cleaning agent because this can suppress dissolution of copper(I) oxide at a surface of a copper-containing wiring film.

When the cleaning agent contains the surfactant, the surfactant content is preferably not more than 1 mass %, more preferably not more than 0.5 mass % and even more preferably not more than 0.25 mass % based on the total mass of the cleaning agent because this can reduce the amount of impurities remaining on a surface of a semiconductor substrate and further suppress contamination of the semiconductor substrate. The lower limit thereof is not particularly limited and is preferably not less than 0.000005 mass %, more preferably not less than 0.00005 mass % and even more preferably not less than 0.00025 mass %.

Preferably, the cleaning agent does not contain other components than the component A, the basic compound, the acidic compound, the surfactant, and water in order to further suppress the influence on metals forming layers of a semiconductor substrate. The phrase "not contain other components" means that the amount of another component is equal to or less than its detection limit, or even when another component is contained, the amount thereof is a trace amount that does not cause any adverse effect on a semiconductor substrate subjected to cleaning.

<Metal Concentration>

In the cleaning agent, the ion concentration of each of metals (elemental metals such as Co, K, Cu, Mg, Mn, Li, Al, Ni and Zn) contained as impurities in the liquid is preferably not more than 5 ppm by mass and more preferably not more than 1 ppm by mass. Since it is expected in manufacture of leading-edge semiconductors that a cleaning agent with even higher purity should be required, the metal ion concentration is still more preferably less than 1 ppm by mass, that is, a value on the order of ppb by mass or less, and particularly preferably a value on the order of ppt by mass. It is most preferable that the cleaning agent be substantially free from metal components.

The method of reducing the metal concentration of the cleaning agent may be one according to the method of reducing the metal concentration of each liquid to be included in the kit described above.

[Concentrated Liquid]

Further, the first and second liquids included in the kit may be mixed with the forms of those liquids being not changed, to thereby prepare a mixed solution (hereinafter also called "concentrated liquid").

The concentrated liquid is for instance diluted in a dilution step to be described later, thereby preparing the cleaning agent. The dilution ratio in this case is not particularly limited, and preferably, the amount of used diluent (e.g., water) is 30 to 200 times by mass based on the total mass of the concentrated liquid.

The pH of the concentrated liquid is for instance 8.0 to 14.0, preferably 9.0 to 12.0 and more preferably 9.0 to 11.5 at 25° C.

The component A content of the concentrated liquid is preferably 0.01 to 50 mass %, more preferably 0.1 to 30 mass % and even more preferably 0.2 to 20 mass % based on the total mass of the concentrated liquid.

The acidic compound content of the concentrated liquid is preferably 0.1 to 50 mass %, more preferably 1 to 40 mass % and even more preferably 2 to 30 mass % based on the total mass of the concentrated liquid.

The basic compound content of the concentrated liquid is preferably 0.2 to 60 mass %, more preferably 1 to 35 mass % and even more preferably 1.5 to 20 mass % based on the total mass of the concentrated liquid.

The organic amine content of the concentrated liquid is preferably 0.001 to 20 mass %, more preferably 0.005 to 10 mass % and even more preferably 0.005 to 5 mass % based on the total mass of the concentrated liquid.

The hydroxylamine compound content of the concentrated liquid is preferably 0.1 to 20 mass %, more preferably 0.5 to 10 mass % and even more preferably 0.5 to 5 mass % based on the total mass of the concentrated liquid.

The quaternary ammonium compound content of the concentrated liquid is preferably 0.1 to 20 mass %, more preferably 0.5 to 15 mass % and even more preferably 1 to 10 mass % based on the total mass of the concentrated liquid.

The surfactant content of the concentrated liquid is preferably 0.001 to 20 mass %, more preferably 0.01 to 10 mass % and even more preferably 0.05 to 5 mass % based on the total mass of the concentrated liquid.

[Preparation of Cleaning Agent]

The method of preparing the cleaning agent is not particularly limited as long as it involves a step of mixing the first and second liquids included in the kit (hereinafter also called "two-liquid mixing step").

The "two-liquid mixing step" represents not only an embodiment in which the first and second liquids included in the kit are mixed with the forms of those liquids being not changed but also any embodiment in which a component or components contained in the first liquid and a component or components contained in the second liquid are mixed to prepare an aqueous solution. For example, an embodiment in which the first and second liquids are mixed after one or each of the first and second liquids is diluted with water or mixed with the third liquid, is also included in the two-liquid mixing step.

In the method of preparing the cleaning agent, a procedure for mixing the liquids included in the kit and water is not particularly limited; one method involves adding each liquid or water into a vessel, followed by mixing under stirring, thereby preparing the cleaning agent. When added to a vessel, each liquid or water may be added at one time or may be divided into plural portions and separately added.

The usage ratio between the first liquid and the second liquid in preparation of the cleaning agent may be adjusted based on the amounts of components contained in the first and second liquids and the composition of the target cleaning agent; for instance, the ratio of the total mass of the second liquid to the total mass of the first liquid is preferably 1 to 9900 mass % and more preferably 5 to 1900 mass %.

In preparation of the cleaning agent, a step of further diluting, with water, the first and second liquids included in the kit (hereinafter also called "dilution step") may be carried out.

A subject to which water is added in the dilution step is not particularly limited, and may be any of the first liquid, the second liquid, and a mixed solution of the first and second liquids.

The dilution ratio when the cleaning agent is prepared through the dilution step may be adjusted based on the amounts of components contained in the first and second liquids and the composition of the target cleaning agent, and for instance, may be 10 to 500 times and is preferably 30 to 200 times in mass ratio based on the sum of the total mass of the first liquid and the second liquid used in preparation of the cleaning agent.

When the kit includes the third liquid, water used in the dilution step may be the third liquid. In this case, the method of preparing the cleaning agent further includes a step of mixing the third liquid with at least one selected from the group consisting of the first liquid, the second liquid, and a mixed solution of the first and second liquids (third liquid mixing step).

The amount of the third liquid used in preparation of the cleaning agent may be adjusted based on the amounts of components contained in the first, second and third liquids and the composition of the target cleaning agent; for instance, the ratio of the total mass of the third liquid to the sum of the total mass of the first liquid and the total mass of the second liquid is preferably 1 to 50 mass % and more preferably 5 to 30 mass %.

In the dilution step, water obtained separately from the kit may be used. For instance, when the cleaning agent is prepared, pure water for dilution may be prepared through refinement separately and added to the first liquid and the second liquid, and optionally the third liquid, included in the kit. Since the most portion of the cleaning agent is water, obtaining water separately from the kit and using the water in the dilution step are sometimes favorable in terms of convenience and cost in the production, transportation and storage of the kit.

Specific methods of mixing and dilution in the foregoing mixing step and dilution step are not particularly limited, and those steps may be carried out according to the method of preparing the first liquid in the production of the kit described above.

A stirrer and a stirring method used in the mixing step and the dilution step are also not particularly limited, and stirring may be carried out with a known stirrer whose examples are listed in the method of preparing the first liquid described above.

The first to third liquids used in preparation of the cleaning agent and water used in the dilution step are preferably subjected to a refining treatment in advance. It is preferable to carry out the refining treatment on a mixed solution obtained by mixing two selected from the first to third liquids and water.

The refining treatment is not particularly limited, and examples thereof include an ionic component reduction treatment using ion-exchange resin or a RO membrane, and removal of foreign matter through filtration, which are described above as examples of the refining treatment for each liquid to be included in the kit; preferably, at least one of these is carried out.

The above examples of the refining treatment for the first to third liquids, water, and the mixed solution may be carried out in combination of plural methods and plural times.

<Container>

The cleaning agent can be put into a given container and stored, transported and used as long as problems such as corrosion do not occur (regardless of whether it is a concentrated liquid or a diluted liquid). Examples of the container include the foregoing containers storing the liquids included in the kit, and its preferable forms are also the same.

(Clean Room)

It is preferable to conduct all of production of the cleaning agent, opening and/or washing of the storage container, handling of the cleaning agent such as filling, process and treatment analyses, and measurements in a cleanroom. The cleanroom preferably satisfies 14644-1 cleanroom standards. The cleanroom satisfies preferably one of ISO (International Organization for Standardization) Class 1, ISO Class 2, ISO Class 3, and ISO Class 4, more preferably ISO Class 1 or ISO Class 2, and even more preferably ISO Class 1.

[Application]

The cleaning agent is usable in any step of a semiconductor substrate manufacturing process and is preferably used for cleaning of a semiconductor substrate having undergone a chemical mechanical polishing (CMP) process.

<Semiconductor Substrate>

A semiconductor substrate to be cleaned with the cleaning agent is not particularly limited as long as the CMP process is applicable thereto, and examples of the semiconductor substrate include one having a metal wiring film, a barrier metal, and an insulating film on a surface of a wafer constituting the semiconductor substrate.

Specific examples of the wafer constituting the semiconductor substrate include wafers made of silicon-based materials such as a silicon (Si) wafer, a silicon carbide (SiC) wafer, and a silicon-containing resin wafer (glass epoxy wafer), a gallium phosphide (GaP) wafer, a gallium arsenide (GaAs) wafer, and an indium phosphide (InP) wafer.

Applicable examples of the silicon wafer include an n-type silicon wafer in which a silicon wafer is doped with a pentavalent atom (e.g., phosphorus (P), arsenic (As), and antimony (Sb)), and a p-type silicon wafer in which a silicon wafer is doped with a trivalent atom (e.g., boron (B), and gallium (Ga)). Silicon of the silicon wafer may be any of, for example, amorphous silicon, monocrystalline silicon, polycrystalline silicon, and polysilicon.

In particular, the cleaning agent is useful for wafers made of silicon-based materials such as a silicon wafer, a silicon carbide wafer, and a silicon-containing resin wafer (glass epoxy wafer).

The semiconductor substrate may have an insulating film on the wafer.

Specific examples of the insulating film include silicon oxide films (e.g., a silicon dioxide ($SiO_2$) film and a tetraethyl orthosilicate ($Si(OC_2H_5)_4$) film (TEOS film)), silicon nitride films (e.g., silicon nitride ($Si_3N_4$) and silicon nitride/carbide (SiNC)), and low dielectric (Low-k) films (e.g., a carbon-doped silicon oxide (SiOC) film and a silicon carbide (SiC) film).

Examples of a metal wiring film that the semiconductor substrate has on a surface of the wafer include a wiring film primarily composed of copper (copper-containing wiring film). Examples of the wiring film primarily composed of copper include a wiring film composed only of metallic copper (copper wiring film) and a wiring film made of an alloy composed of metallic copper and other metals (copper alloy wiring film).

Specific examples of the copper alloy wiring film include a wiring film made of an alloy composed of one or more metals selected from the group consisting of aluminum (Al), titanium (Ti), chromium (Cr), manganese (Mn), tantalum (Ta) and tungsten (W), and copper. More specifically, examples thereof include a copper-aluminum alloy wiring film (CuAl alloy wiring film), a copper-titanium alloy wiring film (CuTi alloy wiring film), a copper-chromium alloy wiring film (CuCr alloy wiring film), a copper-manganese alloy wiring film (CuMn alloy wiring film), a copper-tantalum alloy wiring film (CuTa alloy wiring film), and a copper-tungsten alloy wiring film (CuW alloy wiring film).

The semiconductor substrate may have a cobalt-containing film. The cobalt-containing film refers to a metal film primarily composed of cobalt, and examples thereof include a metal film composed only of metallic cobalt (cobalt metal film) and a metal film made of an alloy composed of metallic cobalt and other metals (cobalt alloy metal film).

Specific examples of the cobalt alloy metal film include a metal film made of an alloy composed of one or more metals selected from the group consisting of titanium (Ti), chromium (Cr), iron (Fe), nickel (Ni), molybdenum (Mo), palladium (Pd), tantalum (Ta) and tungsten (W), and cobalt. More specifically, examples thereof include a cobalt-titanium alloy metal film (CoTi alloy metal film), a cobalt-chromium alloy metal film (CoCr alloy metal film), a cobalt-iron alloy metal film (CoFe alloy metal film), a cobalt-nickel alloy metal film (CoNi alloy metal film), a cobalt-molybdenum alloy metal film (CoMo alloy metal film), a cobalt-palladium alloy metal film (CoPd alloy metal film), a cobalt-tantalum alloy metal film (CoTa alloy metal film), and a cobalt-tungsten alloy metal film (CoW alloy metal film).

In particular, the cleaning agent is useful for the substrate having the cobalt metal film. The cobalt-containing film (a metal film primarily composed of cobalt) is used as, for instance, a barrier metal.

In particular, it is preferable to use the cleaning agent in cleaning of the semiconductor substrate having at least the copper-containing wiring film and the metal film (cobalt barrier metal), which is composed only of metallic cobalt and is a barrier metal of the copper-containing wiring film, on or above the wafer constituting the substrate, with the copper-containing wiring film and the cobalt barrier metal being in contact with each other at a surface of the substrate.

The method of forming the foregoing insulating film, copper-containing wiring film and cobalt-containing film (e.g., cobalt barrier metal) on the wafer constituting the semiconductor substrate is not particularly limited as long as it is a method generally used in this field.

One exemplary method of forming the insulating film is a method in which the wafer constituting the semiconductor substrate is subjected to a heating treatment in the presence of oxygen gas to form a silicon oxide film, whereafter silane and ammonia gases are introduced to form a silicon nitride film by a chemical vapor deposition (CVD) method.

Exemplary methods of forming the copper-containing wiring film and the cobalt-containing film include a method in which a circuit is formed on the wafer having the above insulating film by a known method using a resist for instance, whereafter the copper-containing wiring film and the cobalt-containing film are formed by plating, the CVD method, or another process.

<CMP Process>

The CMP process is, for instance, a process for planarizing a surface of the substrate having the metal wiring film, the barrier metal and the insulating film through a combination of a chemical action induced by use of a polishing slurry containing fine abrasive particles (abrasive grains) and mechanical polishing. Abrasive grains (e.g., silica and alumina) used in the CMP process, metal impurities (metal residues) derived from the polished metal wiring film and barrier metal, and other impurities sometimes remain on the surface of the semiconductor substrate having undergone the CMP process.

These impurities may cause short circuit between wirings and adversely affect electric characteristics of the semiconductor substrate; therefore, the semiconductor substrate having undergone the CMP process is subjected to a cleaning treatment to remove these impurities from the surface of the semiconductor substrate.

<Method of Cleaning Semiconductor Substrate>

The method of cleaning the semiconductor substrate is not particularly limited as long as it is a method in which a surface of the semiconductor substrate having undergone the CMP process is brought into contact with the cleaning agent.

One exemplary method of cleaning the semiconductor substrate is a method in which the semiconductor substrate is immersed in the cleaning agent prepared using the kit, thereby cleaning the semiconductor substrate. In this process, an ultrasonic treatment is preferably carried out on the cleaning agent having the semiconductor substrate immersed therein because this can further reduce impurities remaining on the surface of the semiconductor substrate.

The method of cleaning is not limited to immersion, and use may be made of any method generally employed in this field such as a spinning (dropping) method in which the cleaning agent is dropped while the semiconductor substrate is rotated, or a spraying method in which the cleaning agent is sprayed.

The method of cleaning the semiconductor substrate to be employed may be any of a single wafer process and a batch process. The single wafer process is a method in which semiconductor substrates are treated one by one, while the batch process is a method in which a plurality of semiconductor substrates are treated at one time.

The treatment temperature in cleaning of the semiconductor substrate is not particularly limited as long as it is one generally used in this field. As specific examples of the treatment temperature, generally, a temperature of 10° C. to 40° C. is preferred, and a temperature of 15° C. to 30° C. is more preferred.

In the examples below, the pH values of first liquids, second liquids and cleaning agents were measured with a pH meter (type: F-74, manufactured by HORIBA, Ltd.) according to JIS Z 8802-1984.

Preparation of Evaluation Test Solution

Example 1

Pyrogallol was used as the component A, and tartaric acid was used as the acidic compound. Pyrogallol and tartaric acid were mixed with water to prepare a first liquid having the composition shown in Table 1. The pH of the first liquid was 1.2.

Piperazine (organic amine), N,N-diethylhydroxylamine (DEHA, hydroxylamine derivative), and choline (quaternary ammonium compound) were used as the basic compounds. Piperazine, DEHA and choline were mixed with water to prepare a second liquid having the composition shown in Table 1. The pH of the second liquid was 13.3.

Example 2

A first liquid and a second liquid with the relevant compositions shown in Table 1 were prepared in the same manner as in Example 1. The pH of the first liquid was 1.1, and the pH of the second liquid was 13.3.

Comparative Example 1

Pyrogallol, tartaric acid, piperazine, DEHA and choline were mixed with water to prepare a single liquid type cleaning agent having the composition shown in Table 1. The pH of the cleaning agent of Comparative Example 1 was 11.8.

TABLE 1

| | | Component A | | Acidic compound | | Basic compound | | | | | | pH of |
|---|---|---|---|---|---|---|---|---|---|---|---|---|
| | Type | Type | mass % | Type | mass % | Type | mass % | Type | mass % | Type | mass % | liquid |
| Example 1 | First liquid | Pyrogallol | 2.5 | Tartaric acid | 19.0 | — | — | — | — | — | — | 1.2 |
| | Second liquid | — | — | — | — | Piperazine | 0.1 | DEHA | 5.0 | Choline | 3.7 | 13.3 |
| Example 2 | First liquid | Pyrogallol | 10.0 | Tartaric acid | 19.0 | — | — | — | — | — | — | 1.1 |
| | Second liquid | — | — | — | — | Piperazine | 0.1 | DEHA | 5.0 | Choline | 4.5 | 13.3 |
| Comparative Example 1 | Single liquid type | Pyrogallol | 0.025 | Tartaric acid | 1.9 | Piperazine | 0.1 | DEHA | 4.5 | Choline | 3.3 | 11.8 |

The cleaning time in cleaning of the semiconductor substrate depends on the types and the amounts of components contained in the cleaning agent and therefore cannot be unconditionally stated; Practically, in general, the cleaning time is preferably 10 seconds to 2 minutes, more preferably 20 seconds to 1 minute and 30 seconds, and even more preferably 30 seconds to 1 minute.

EXAMPLES

The present invention is described below in further detail based on examples. The materials, amounts of use, and ratios illustrated in examples below may be modified as long as they do not depart from the scope and spirit of the present invention. Therefore, the scope of the present invention should not be construed as being limited to the examples below.

[Evaluation of Storage Stability]
(1) Storage Test

The first liquids obtained in Examples and the single liquid type cleaning agent obtained in Comparative Example 1 were used as test liquids and evaluated for storage stability.

A 100 mL plastic container was filled with 100 mL of each test liquid, a space was replaced with nitrogen gas, and the container was sealed. The plastic containers each filled with the test liquid were stored at temperatures of 0° C., 10° C., 25° C., 40° C. and 50° C. for 3 or 6 months to observe the change over time through the storage test.

(2) Measurement of Change of Test Liquid Over Time

After the storage test, 1 g of each test liquid was taken and diluted with water by 4000 times in mass ratio, thereby obtaining a measurement sample. The component A content of the measurement sample was quantitatively determined by high-performance liquid chromatography (developing solvent: acetonitrile:water=1:19-0.1% phosphoric acid added, flow speed: 1.2 mL/min, UV detect: 200 nm, holding time: 6.9 min). Based on the quantitative results, there were calculated a relative ratio (unit: mass %) of the component A content of each test liquid measured immediately after the test liquid was prepared to the theoretical component A content of the test liquid, and a relative ratio (unit: mass %) of the component A content of each test liquid measured after the storage test to the theoretical component A content of the test liquid. The results are shown in Table 2.

With the test liquid of Comparative Example 1 having the component A, the acidic compound and the basic compounds being present in the same solution, the component A content "immediately after the test liquid was prepared" was 76 mass % with respect to the theoretical content and thus decreased with respect to the theoretical content. This is probably because the decomposition of the component A started immediately after the components were mixed to prepare the test liquid.

verted to the amount of hydrogen peroxide, equivalent to 1.1 mass %, to a solution produced according to Example Sl of JP 2011-3665 A. The produced simulation slurry was an aqueous dispersion containing 5 mass % of fine abrasive particles (hereinafter also called "abrasive grains") with a volume average particle size of 40 nm.

The wafer piece having undergone the foregoing pretreatment was subjected to the CMP process using a CMP experimental apparatus (manufactured by MAT, type: ARW-461M) equipped with a polishing pad (manufactured by Nitta Haas Inc., type: IC-1400), while being supplied with the simulation slurry. The CMP process was carried out under the following polishing conditions.

Head rotation speed: 103 rpm
Platen rotation speed: 91 rpm
Polishing pressure: 5 kPa
Polishing time: 30 seconds
Slurry flow rate: 50 mL/min

TABLE 2

| | | Component A content (mass %) | | | | | | | | | | |
|---|---|---|---|---|---|---|---|---|---|---|---|---|
| | | Immediately after | After 3-month storage | | | | | After 6-month storage | | | | |
| | Test liquid | preparation | 0° C. | 10° C. | 25° C. | 40° C. | 50° C. | 0° C. | 10° C. | 25° C. | 40° C. | 50° C. |
| Example 1 | First liquid | 100 | 100 | 100 | 100 | 100 | 99 | 100 | 100 | 100 | 100 | 99 |
| Example 2 | First liquid | 100 | 100 | 100 | 100 | 100 | 100 | 100 | 100 | 100 | 99 | 99 |
| Comparative Example 1 | Single liquid type | 76 | 32 | 25 | <5 | <5 | <5 | <5 | <5 | <5 | <5 | <5 |

[Evaluation of Maintainability of Impurity Removal Performance of Cleaning Agent]

The maintainability of impurity removal performance for a semiconductor substrate having undergone the CMP process was evaluated by the following test method.

(1) Preparation of Cleaning Agent for Maintainability Evaluation

The first liquid and the second liquid obtained in each Example were mixed at a mass ratio of 1:9. The obtained mixed solution was diluted with ultrapure water by 50 times in mass ratio, thereby preparing a cleaning agent for evaluation. As the cleaning agents for evaluation, there were used a cleaning agent prepared with the first and second liquids having been just prepared by the methods described in [Preparation of Evaluation Test Solution] above, and a cleaning agent prepared with the first and second liquids thus prepared and then stored at 25° C. for 7 months according to the method of the foregoing storage test.

In addition, the cleaning agent of Comparative Example 1 prepared by the method described in [Preparation of Evaluation Test Solution] above, and the cleaning agent thus prepared and then stored at 25° C. for 7 months according to the method of the foregoing storage test were each diluted with ultrapure water by 50 times in mass ratio, thereby preparing comparative cleaning agents.

(2) CMP Process of Wafer

A wafer having a cobalt single layer film (manufactured by Philtech Inc.; which was obtained by vapor-depositing cobalt metal to 400 nm on a silicon substrate) was cut into a piece with a size of 2 cm length×2 cm width and immersed in 0.1 N aqueous hydrochloric acid solution for 1 minute. The wafer piece thus obtained was washed with ultrapure water and dried with nitrogen gas.

A simulation slurry was produced by adding 35 mass % hydrogen peroxide solution whose amount was, when con- (3) Cleaning of Wafer Surface with Cleaning Agent Each of the cleaning agents for evaluation and the comparative cleaning agents prepared in (1) above (100 mL) was put into a plastic cup, and the CMP-processed wafer piece above was immersed therein. The wafer piece immersed in each cleaning agent was subjected to 15-second ultrasonic cleaning using an ultrasonic device (manufactured by Aiwa Medical Industry Co., Ltd., type: FU-80C). Thereafter, the wafer piece was taken out, rinsed with ultrapure water and dried with nitrogen gas.

(4) Measurement of Number of Remaining Abrasive Grains

A surface of an evaluation substrate was observed using an ultra-high resolution scanning electron microscope (SEM, manufactured by Hitachi High-Tech Corporation, type: S-4800), and the number of abrasive grains remaining on the surface was counted. The observation conditions of the SEM were specified to a magnification of 20000× and an acceleration voltage of 10000 V.

In the above measurement, the observation was carried out at 13 different places on the surface of the same evaluation substrate, and the number of abrasive grains (observed as spherical objects with a diameter of about 50 nm (30 to 60 nm) in an SEM image) present in a visual field was counted. The sum of the obtained measurement results at the 13 points was determined as the number of remaining abrasive grains.

(5) Calculation of Rate of Increase of Abrasive Grains Before and after Storage Test The rate of change of the number of remaining abrasive grains before and after the storage test (rate of increase of abrasive grains) was calculated from the number (Ci) of abrasive grains remaining on a surface of an evaluation substrate cleaned with each test liquid that had been just prepared and the number (Ca) of abrasive grains remaining on a surface of an evaluation substrate cleaned with each test liquid that had been stored at 25° C. for 7 months, by Equation <1>:

Rate of increase of abrasive grains (%)=(Ca−Ci)/Ci×100   Equation 1

The increase of the number of abrasive grains remaining on a wafer surface is not favorable in terms of cleaning performance, and this may lead to a lower yield in a subsequent wafer film formation step. Accordingly, when the rate of increase of abrasive grains was +20% or less, the maintainability of impurity removal performance of the cleaning agent (cleaning performance of the cleaning agent) was rated as "excellent," whereas when the rate of increase of abrasive grains exceeded+20%, the maintainability of impurity removal performance of the cleaning agent (cleaning performance of the cleaning agent) was rated as "poor."

The column of "pH before dilution" in Table 3 represents a pH value of a mixed solution obtained by mixing the first and second liquids and before being diluted in the case of Examples 1 and 2, and a pH value of the cleaning agent after being prepared and before being diluted in the case of Comparative Example 1.

TABLE 3

| | Type of claining agent | pH before dilution | Dilution ratio | Number of initial remaining abrasive grains (number) | Number of remaining abrasive grains after 7-month storage (number) | Rate of increase of abrasive grains (%) | Maintainability of impurity removal performance |
|---|---|---|---|---|---|---|---|
| Example 1 | Two liquid type | 10.4 | 50 times | 19 | 20 | 5.3 | Excellent |
| Example 2 | Two liquid type | 10.4 | 50 times | 11 | 12 | 9.1 | Excellent |
| Comparative Example 1 | Single liquid type | 11.8 | 50 times | 93 | 183 | 96.8 | Poor |

As can be seen in Tables 1 and 3, it was confirmed that in the case of the kit of the invention including the first liquid containing the component A represented by Formula (1) and showing acidic properties and the second liquid containing the basic compound and showing alkaline properties, it is possible to prepare the cleaning agent with the performance of removing impurities on a surface of a semiconductor substrate having undergone the CMP process being maintained even after a long-term storage as compared to the conventional single liquid type cleaning agent.

What is claimed is:

1. A kit for preparing a cleaning agent with a pH of 7.5 to 13.0 that is used in cleaning of a semiconductor substrate having undergone a chemical mechanical polishing process, the kit comprising:
   a first liquid containing a compound represented by Formula (1), an acidic compound and water and showing acidic properties; and
   a second liquid containing a basic compound and showing alkaline properties,
   wherein the basic compound comprises a hydroxylamine compound, and the basic compound further comprises at least one selected from the group consisting of a diamine compound, an amidine compound, an azole compound, a pyrazine compound, a pyrimidine compound, and a quaternary ammonium compound,

[Chemical Formula 1]

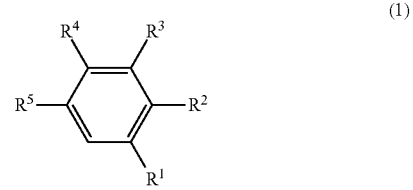

where $R^1$ to $R^5$ each independently represent a hydrogen atom, a hydroxyl group, a carboxyl group, or an alkoxycarbonyl group, and at least two of $R^1$ to $R^5$ represent a hydroxyl group, provided that a combination in which $R^1$ and $R^5$ each represent a hydroxyl group, a combination in which $R^2$ and $R^4$ each represent a hydroxyl group, and a combination in which $R^3$ and $R^5$ each represent a hydroxyl group are excluded.

2. The kit according to claim 1,
   wherein the compound represented by Formula (1) includes at least one selected from the group consisting of pyrogallol, pyrocatechol, hydroquinone, dihydroxybenzoic acid, gallic acid, and gallic acid esters.

3. The kit according to claim 1,
   wherein the compound represented by Formula (1) includes pyrogallol.

4. The kit according to claim 1,
   wherein the acidic compound includes carboxylic acid.

5. The kit according to claim 4,
   wherein the carboxylic acid has two or more carboxyl groups.

6. The kit according to claim 4,
   wherein the carboxylic acid further has at least one hydroxyl group.

7. The kit according to claim 1,
   wherein the basic compound comprises the hydroxylamine compound and further comprises at least one selected from the group consisting of a diamine compound and a quaternary ammonium compound.

8. The kit according to claim 1,
   wherein the diamine compound is a compound represented by Formula (2):

[Chemical Formula 2]

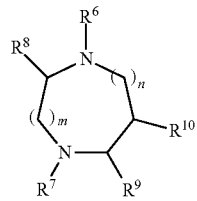
(2)

where $R^6$ and $R^7$ each independently represent a hydrogen atom, an alkyl group having 1 to 4 carbon atoms, or an aryl group having 6 to 10 carbon atoms, $R^8$ represents a hydrogen atom, a hydroxyl group, or an alkyl group having 1 to 4 carbon atoms that may have a hydroxyl group, $R^9$ and $R^{10}$ each independently represent a hydrogen atom or an alkyl group having 1 to 4 carbon atoms, $R^6$ and $R^7$, $R^7$ and $R^{10}$, or $R^8$ and $R^{10}$ may be bonded together to form an alkylene group having 1 to 3 carbon atoms, m represents 0 or 1, and n represents an integer of 0 to 2.

9. The kit according to claim 1,
   wherein the hydroxylamine compound is a compound represented by Formula (6) or its salt,

[Chemical Formula 3]

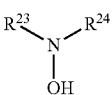
(6)

where $R^{23}$ represents an alkyl group having 1 to 6 carbon atoms, and $R^{24}$ represents a hydrogen atom or an alkyl group having 1 to 6 carbon atoms.

10. The kit according to claim 1,
    wherein the quaternary ammonium compound is at least one selected from the group consisting of tetramethylammonium hydroxide, tetraethylammonium hydroxide, tetrapropylammonium hydroxide, tetrabutylammonium hydroxide, 2-hydroxyethyl trimethylammonium hydroxide, and bis (2-hydroxyethyl) dimethylammonium hydroxide.

11. The kit according to claim 1,
    wherein the semiconductor substrate has either a copper wiring film or a copper alloy wiring film, and a cobalt-containing film.

12. The kit according to claim 11,
    wherein the cobalt-containing film is a barrier metal of the copper wiring film or the copper alloy wiring film.

13. The kit according to claim 1,
    wherein a pH of the first liquid is not more than 5.0.

* * * * *